(12) United States Patent
Wakiyama

(10) Patent No.: US 11,637,049 B2
(45) Date of Patent: Apr. 25, 2023

(54) SEMICONDUCTOR DEVICE HAVING SEMICONDUCTOR CHIP FORMED ON WIRING PART, AND METHOD OF MANUFACTURING THE SAME

(71) Applicant: FUJI ELECTRIC CO., LTD., Kawasaki (JP)

(72) Inventor: Tomoyuki Wakiyama, Nagano (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/355,799

(22) Filed: Jun. 23, 2021

(65) Prior Publication Data
US 2022/0068748 A1 Mar. 3, 2022

(30) Foreign Application Priority Data
Aug. 25, 2020 (JP) .............................. JP2020-142024

(51) Int. Cl.
| H01L 23/36 | (2006.01) |
| H01L 21/50 | (2006.01) |
| H01L 23/528 | (2006.01) |
| H01L 23/02 | (2006.01) |

(52) U.S. Cl.
CPC .............. H01L 23/36 (2013.01); H01L 21/50 (2013.01); H01L 23/02 (2013.01); H01L 23/528 (2013.01)

(58) Field of Classification Search
CPC ................................ H01L 23/36; H01L 21/50

USPC .......................................................... 257/690
See application file for complete search history.

(56) References Cited

U.S. PATENT DOCUMENTS

| 2005/0082690 A1 | 4/2005 | Hayashi et al. |
| 2017/0064808 A1* | 3/2017 | Rizza ...................... H01L 23/36 |
| 2017/0229389 A1 | 8/2017 | Katsuki |
| 2019/0371625 A1* | 12/2019 | Sakamoto ......... H01L 23/49586 |

FOREIGN PATENT DOCUMENTS

| JP | 2001-358263 A | 12/2001 |
| JP | 2003-124400 A | 4/2003 |
| JP | 2005-123495 A | 5/2005 |
| JP | 2009-105267 A | 5/2009 |
| JP | 2017-139406 A | 8/2017 |

* cited by examiner

*Primary Examiner* — Quoc D Hoang
(74) *Attorney, Agent, or Firm* — Rabin & Berdo, P.C.

(57) ABSTRACT

A semiconductor device, including a semiconductor chip having a first electrode on a rear surface thereof, a laminated substrate including a heat dissipation board laminated on a rear surface of an insulating board, and a case. The case includes a frame surrounding an opening penetrating the case from a front surface to a rear surface thereof, the frame being in contact with a periphery of the laminated substrate covering the opening from the rear surface of the case, and a first terminal penetrating the frame. The first terminal includes a first connection part penetrating the frame and extending out of the frame, and a first wiring part provided in the opening. The first wiring part has a wiring rear surface disposed on a front surface of the insulating board, and a wiring front surface mechanically and electrically connected to the first electrode of the semiconductor chip.

18 Claims, 17 Drawing Sheets

SEMICONDUCTOR DEVICE HAVING SEMICONDUCTOR CHIP FORMED ON WIRING PART, AND METHOD OF MANUFACTURING THE SAME

CROSS-REFERENCE TO RELATED APPLICATIONS

This application is based upon and claims the benefit of priority of the prior Japanese Patent Application No. 2020-142024, filed on Aug. 25, 2020, the entire contents of which are incorporated herein by reference.

BACKGROUND OF THE INVENTION

1. Field of the Invention

The embodiments discussed herein relate to a semiconductor device and a method of manufacturing the same.

2. Background of the Related Art

Semiconductor devices include power devices. For example, the power devices are semiconductor chips including insulated gate bipolar transistors (IGBTs) and power metal oxide semiconductor field effect transistors (MOSFETs) formed therein. A semiconductor device includes an insulated circuit board having such semiconductor chips mounted thereon and a heat dissipation board on which the insulated circuit board is disposed. The insulated circuit board includes an insulating board and a circuit pattern formed on the front surface of the insulating board. The semiconductor chips are bonded onto the circuit pattern. In addition, in the semiconductor device, a case is attached around the outer edge of the insulated circuit board with an adhesive. Input and output lead frames are attached to the case by insert molding. Inside the case, the semiconductor chips and the lead frames are electrically connected with wires (see, for example, Japanese Laid-open Patent Publication No. 2017-139406).

Such a semiconductor device is manufactured by the following steps. First, an insulated circuit board is placed on a heat dissipation board, and semiconductor chips are bonded to the insulated circuit board. A case is fixed to the outer edge of the insulated circuit board with an adhesive. Then, various lead frames insert-molded into the case, the main electrodes and control electrodes of the semiconductor chips, and circuit patterns on the insulated circuit board are connected as appropriate with wires. As a final step, a sealing member is inserted in the case and is cured. In the manner described above, the semiconductor device is manufactured.

By the way, it is desired to further reduce the manufacturing cost for semiconductor devices. As a means to solve this, there is an attempt to reduce the number of steps in the manufacturing. In the case of the above semiconductor device, there is a step of attaching the case to the insulated circuit board with the adhesive. In this attachment step, the adhesive may overflow from the adhesive area between the insulated circuit board and the case. The scattering or flowing of the overflowing adhesive may prevent appropriate bonding using the wires between the semiconductor chips and the lead frames. To avoid this bonding failure of the wires, another step of wiping the overflowing adhesive is needed. This will increase the manufacturing cost of semiconductor devices, which goes against the reduction of the manufacturing cost.

SUMMARY OF THE INVENTION

According to one aspect, there is provided a semiconductor device, including: a semiconductor chip including a first electrode on a rear surface thereof; a laminated substrate including an insulating board and a heat dissipation board laminated on a rear surface of the insulating board; and a case, including a frame surrounding an opening penetrating the case from a front surface of the case to a rear surface of the case, the frame being in contact with a periphery of the laminated substrate, the laminated substrate covering the opening from the rear surface of the case, and a first terminal penetrating the frame, the first terminal including a first connection part penetrating the frame and extending out of the frame, and a first wiring part provided in the opening, the first wiring part having a wiring rear surface disposed on a front surface of the insulating board, and a wiring front surface mechanically and electrically connected to the first electrode of the semiconductor chip.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, some embodiments will be described with reference to the accompanying drawings. In the following description, the terms "front surface" and "upper surface" represent surfaces facing up in a semiconductor device 10 illustrated in FIGS. 1 and 2. Similarly, the term "up" represents an upward direction in the semiconductor device 10 of FIGS. 1 and 2. The terms "rear surface" and "lower surface" represent surfaces facing down in the semiconductor device 10 of FIGS. 1 and 2. The term "down" represents a downward direction in the semiconductor device 10 of FIGS. 1 and 2. The same directionality applies to the other drawings, as appropriate. The terms "front surface," "upper surface," "up," "rear surface," "lower surface," "down," and "side surface" are used for convenience to describe relative positional relationships, and do not limit the technical ideas of the embodiments. For example, the terms "up" and "down" do not always represent the vertical direction to the ground. That is, the "up" and "down" directions are not limited to the gravity direction. In addition, in the following description, a component contained at a volume ratio of 80 vol % or more is called a "principal component."

First Embodiment

Figure 1:
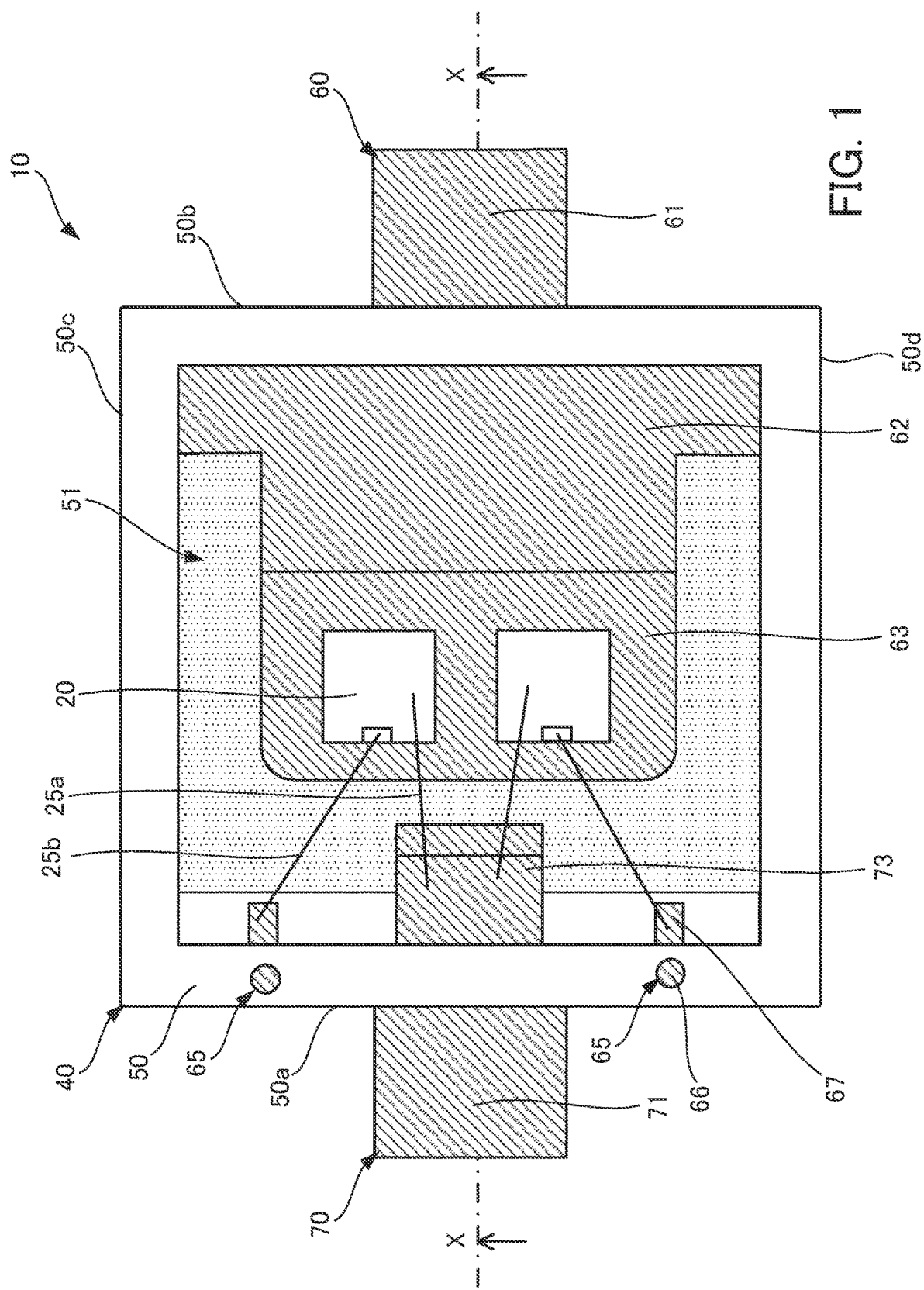
FIG. 1 is a plan view of a semiconductor device according to a first embodiment.
Figure 2:
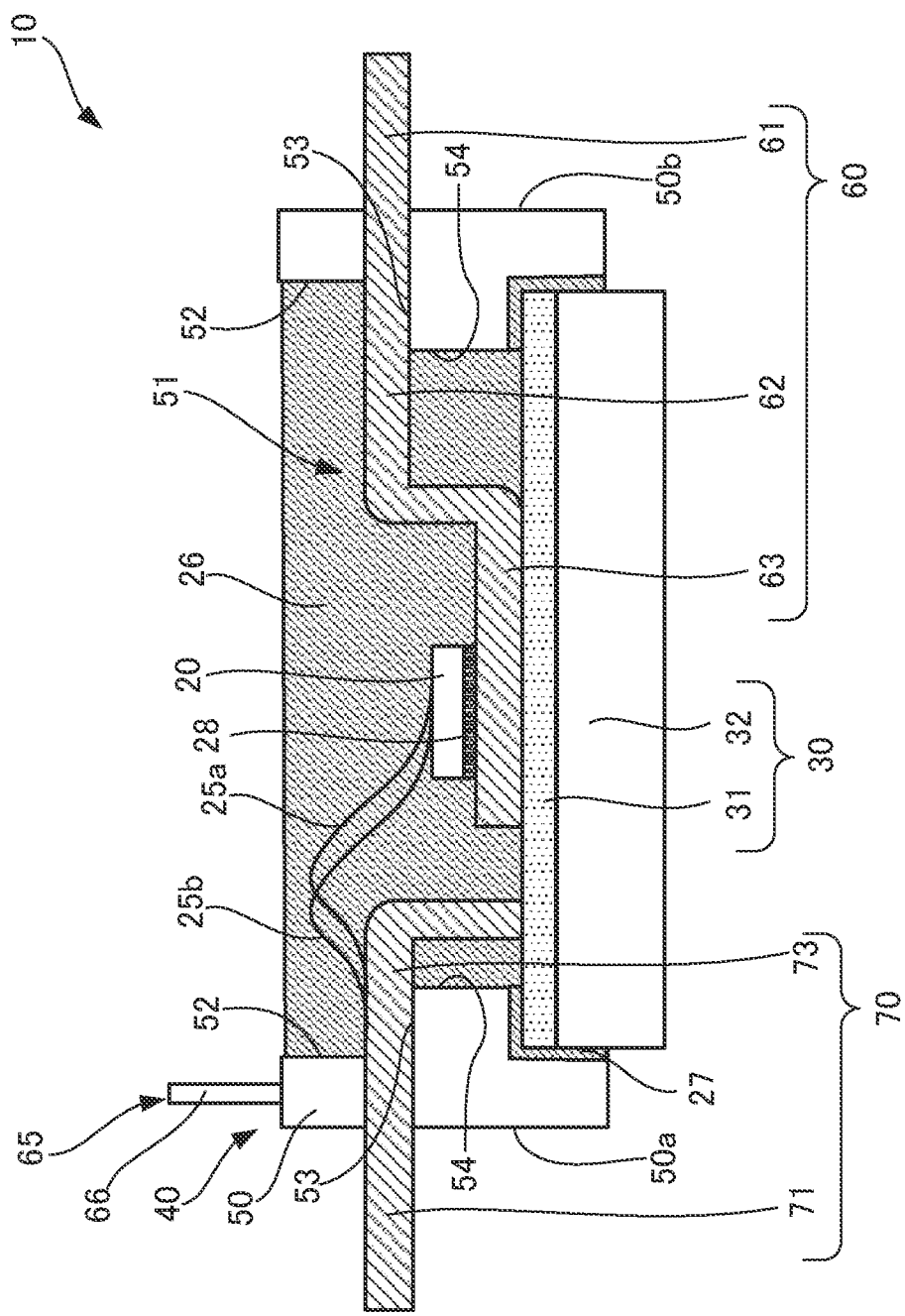
FIG. 2 is a sectional view of the semiconductor device according to the first embodiment.

A semiconductor device of a first embodiment will be described with reference to FIGS. 1 and 2. FIG. 1 is a plan view of the semiconductor device according to the first embodiment, and FIG. 2 is a sectional view of the semiconductor device according to the first embodiment. Note that FIG. 2 is a sectional view taken along the dot-dashed line X-X of FIG. 1.

The semiconductor device 10 includes semiconductor chips 20, a laminated substrate 30, and a case 40. Note that a sealing member 26 is not illustrated in FIG. 1. The semiconductor chips 20 are made of a material containing silicon or silicon carbide as a principal component. The above semiconductor chips 20 individually include a reverse conducting (RC)-IGBT switching element, which integrates an IGBT and a free wheeling diode (FWD) on a single chip. In the RC-IGBT chip, the collector side of the IGBT is electrically connected to the cathode side of the FWD, and the emitter side of the IGBT is electrically connected to the anode side of the FWD. The RC-IGBT chip forms a circuit in which the IGBT and FWD are connected in inverse parallel. Such a semiconductor chip 20 has a collector electrode serving as a main electrode (input electrode) on its rear surface and also has a gate electrode (control electrode) and an emitter electrode serving as a main electrode (output electrode) on its front surface.

The rear surfaces of the semiconductor chips 20 are mechanically and electrically bonded to a first external connection terminal 60 with a bonding member 28. In this connection, a solder or a sintered metal may be used as the bonding member 28. The solder is a lead-free solder containing a prescribed alloy as a principal component. For example, the prescribed alloy is at least one of a tin-silver alloy, a tin-zinc alloy, and a tin-antimony alloy. The solder may contain an additive. Examples of the additive include copper, bismuth, indium, nickel, germanium, cobalt, and silicon. Examples of the sintered metal include aluminum and copper.

In addition, the semiconductor chips 20 illustrated in FIG. 1 are disposed with their control electrodes facing toward the left side in FIG. 1 (toward a second external connection terminal 70). In addition, as an example, FIG. 1 illustrates a case where two semiconductor chips 20 are aligned in a vertical direction of FIG. 1. One or three or more semiconductor chips 20 may be disposed, and the semiconductor chips 20 may be arranged where appropriate according to its quantity and the specifications of the semiconductor device 10. In addition, in the semiconductor chips 20, one or more combinations of switching element and diode element may be disposed, in place of the RC-IGBTs. In this case, IGBTs and power MOSFETs may be used as the switching elements. In the case where a semiconductor chip 20 is an IGBT, the semiconductor chip 20 has a collector electrode serving as a main electrode (input electrode) on its rear surface, and a gate electrode (control electrode) and an emitter electrode serving as a main electrode (output electrode) on its front surface. In the case where a semiconductor chip 20 is a power MOSFET, the semiconductor chip 20 has a drain electrode serving as a main electrode on its rear surface and also has a gate electrode and a source electrode serving as a main electrode on its front surface. The rear surfaces of the above semiconductor chips 20 are mechanically and electrically bonded to the first external connection terminal 60 with the bonding member 28. In addition, for example, FWDs such as Schottky barrier diodes (SBDs) and P-intrinsic-N (PiN) diodes may be used as the diode elements. Such a semiconductor chip 20 has an output electrode (cathode electrode) serving as a main electrode on its rear surface and also has an input electrode (anode electrode) serving as a main electrode on its front surface. The rear surfaces of the above semiconductor chips 20 are mechanically and electrically bonded to the first external connection terminal 60 with the bonding member 28.

The laminated substrate 30 includes an insulating board 31 and a heat dissipation board 32. In this connection, the corners of the insulating board 31 and heat dissipation board 32 may be rounded or chamfered. The insulating board 31 and heat dissipation board 32 are equal in size in a plan view.

As the insulating board 31, an organic insulating layer or a ceramics substrate may be used. The organic insulating layer is formed like a sheet and is made of a mixture of a resin with low thermal resistance and a filler material with high thermal conductivity. The former resin may be an insulating resin such as an epoxy resin or a liquid crystal polymer, for example. The latter filler material may be boron nitride, aluminum oxide, or silicon oxide, for example. The ceramics substrate is made of ceramics with high thermal conductivity. For example, the ceramics may be a material containing aluminum oxide, aluminum nitride, or silicon nitride as a principal component. The insulating board 31 has a thickness in a range of 0.5 mm to 2.0 mm, inclusive. In the first embodiment, the insulating board 31 is an organic insulating layer. The thickness of the insulating board 31, which is an organic insulating layer, depends on the rated voltage of the semiconductor device 10. That is, it is desired that the insulating board 31 is made thicker as the rated voltage of the semiconductor device 10 is higher. However, it is also desired that the insulating board 31 is made as thin as possible to reduce the thermal resistance.

The heat dissipation board 32 is made using a metal with high thermal conductivity as a principal component. Examples of this metal include aluminum, iron, silver, copper, and an alloy containing at least one of these. The heat dissipation board 32 may be made of a composite material with high thermal conductivity and low linear expansion coefficient. Such a composite material contains a combination of magnesium and silicon carbide or a combination of aluminum and silicon carbide as a principal component, for example. In addition, the heat dissipation board 32 has a thickness in a range of 1.0 mm to 10.0 mm, inclusive. To improve the corrosion resistance, plating may be performed on the surface of the heat dissipation board 32.

Examples of the plating material used for this plating include nickel, a nickel-phosphorus alloy, and a nickel-boron alloy.

The case 40 includes a frame 50, and the first and second external connection terminals 60 and and control terminals 65 insert-molded into the frame 50. In a plan view, the frame 50 has an opening 51 penetrating from the front surface (front surface of the case) to the rear surface (rear surface of the case) at the center. In the plan view, the frame 50 includes side portions 50a to 50d that form a rectangle and surround the opening 51 from all four sides. The frame 50 also includes upper inner walls 52, terminal pedestals 53, and lower inner walls 54 that face the opening 51. The upper inner walls 52 surround the opening 51 from all four sides and face the opening 51. The terminal pedestals 53 project from below the upper inner walls 52 of the side portions 50a and 50b toward the inside of the opening 51. The lower inner walls 54 are provided vertically downward from the projecting ends of the terminal pedestals 53. The periphery of the laminated substrate 30 is bonded to the rear surface of the frame 50 with an adhesive member 27. Therefore, the front surface of the laminated substrate 30 is exposed in the opening 51. The frame 50 is slightly larger in size than the laminated substrate 30. In addition, the rear surface of the laminated substrate 30 bonded to the frame 50 in this way projects more downward than the rear surface of the frame 50. The frame 50 is made of a mixture of a thermosetting resin and a filler material. Examples of the thermosetting resin include an epoxy resin, a phenol resin, and a maleimide resin. Examples of the filler material include silicon oxide, aluminum oxide, boron nitride, and aluminum nitride. As an example, this mixture contains an epoxy resin and silicon oxide, which is mixed with the epoxy resin as a filler.

The first and second external connection terminals 60 and 70 and control terminals 65 are insert-molded into the frame 50. The first and second external connection terminals 60 and 70 and control terminals 65 are individually made using a metal with high electrical conductivity as a principal component. Examples of such a metal include silver, copper, nickel, aluminum, and an alloy containing at least one of these. In addition, the first and second external connection terminals 60 and 70 individually have a thickness in a range of 0.1 mm to 2.0 mm, inclusive, and preferably in a range of 0.2 mm to 1.0 mm, inclusive. To improve the corrosion resistance, plating may be performed on the surfaces of the first and second external connection terminals 60 and 70 and control terminals 65. Examples of the plating material used for this plating include nickel, a nickel-phosphorus alloy, and a nickel-boron alloy.

The first external connection terminal 60 is insert-molded into the side portion 50b of the frame 50. The first external connection terminal 60 integrally includes a first connection part 61, a first linking part 62, and a first wiring part 63. The first connection part 61 extends from the side portion 50b of the frame 50 to the outside (to the right side in FIG. 2). The rear surface (wiring rear surface) of the first wiring part 63 is in contact with the front surface (insulating principal surface) of the laminated substrate 30 (insulating board 31) at approximately the center of the laminated substrate 30. The front surface (wiring front surface) of the first wiring part 63 is mechanically and electrically bonded to the semiconductor chips 20 with the bonding member 28. The first linking part 62 integrally links the first connection part 61 and the first wiring part 63. The first linking part 62 communicates with the first connection part 61, penetrates the side portion 50b of the frame 50, extends into the opening 51, and is placed on the entire surface of the terminal pedestal 53. The first linking part 62 has a width that becomes narrower from a part thereof placed on the terminal pedestal 53, extends into the opening 51, and is bent vertically downward so that the first linking part 62 has a width approximately equal to that of the first wiring part 63 and communicates with the first wiring part 63.

The second external connection terminal 70 is insert-molded into the side portion 50a of the frame 50. The second external connection terminal 70 integrally includes a second connection part 71 and a second wiring part 73. The second connection part 71 extends from the side portion 50a of the frame 50 to the outside (to the left side in FIG. 2). The second wiring part 73 communicates with the second connection part 71, penetrates the side portion 50a of the frame 50, extends into the opening 51, and is placed on the terminal pedestal 53. The second wiring part 73 also extends vertically downward and then contacts with the front surface of the laminated substrate 30. Then, the second external connection terminal 70 is grounded. The second wiring part 73 and the main electrodes (output electrodes) of the semiconductor chips 20 are electrically connected with main wires 25a. As illustrated in FIG. 1, the width of the second connection part 71 is narrower than that of the first wiring part 63.

The control terminals 65 are insert-molded into the side portion 50a of the frame 50. Each control terminal 65 integrally includes a control connection part 66 and a control wiring part 67. The control connection part 66 extends from the front surface of the side portion 50a of the frame 50 to the outside (upward in FIG. 2). The control wiring part communicates with the control connection part 66, penetrates the side portion 50a of the frame 50, and is exposed on the terminal pedestal 53. The two control terminals 65 are disposed so as to have the second external connection terminal 70 therebetween. The control wiring parts 67 of the two control terminals 65 and the control electrodes of the two semiconductor chips 20 are electrically connected with control wires 25b, respectively.

In this connection, the main wires 25a and control wires 25b are individually made using a metal with high electrical conductivity as a principal component. Examples of the metal include gold, silver, copper, aluminum, and an alloy containing at least one of these. In addition, for example, the main wires 25a have a diameter in a range of 150 μm to 600 μm, inclusive, and the control wires 25b have a diameter in a range of 100 μm to 130 μm, inclusive.

The opening 51 of the case 40 is sealed with the sealing member 26. The sealing member 26 contains a thermosetting resin and a filler. Example of the thermosetting resin include an epoxy resin, a phenol resin, and a maleimide resin. Examples of the filler include silicon oxide, aluminum oxide, boron nitride, and aluminum nitride. As a specific example, this sealing member 26 contains a mixture of an epoxy resin as a principal component and boron nitride as the filler. Alternatively, a silicone gel may be used as the sealing member 26. In this case, after the opening 51 is sealed with the sealing member 26, a case lid (not illustrated) is placed on the opening 51 of the case 40 to close the opening 51.

In this connection, the heat dissipation capability of the semiconductor device 10 may be increased by attaching a cooler (not illustrated) to the rear surface of the laminated substrate 30 with a solder, a silver solder, or the like. The cooler here is made using a metal with high thermal conductivity as a principal component. Examples of the metal include aluminum, iron, silver, copper, and an alloy containing at least one of these. In addition, as the cooler, a heatsink or a cooling device employing water cooling may be used, for example. The heat dissipation board 32 of the laminated substrate 30 may integrally be formed with such a cooler. In this case, such an integral unit may be made using a metal with high thermal conductivity as a principal component. Examples of the metal include aluminum, iron, silver, copper, and an alloy containing at least one of these. To improve the corrosion resistance, plating using a plating material may be performed on the surface of the heat dissipation board 32 integrally formed with the cooler. Examples of the plating material include nickel, a nickel-phosphorus alloy, and a nickel-boron alloy.

Figure 3:
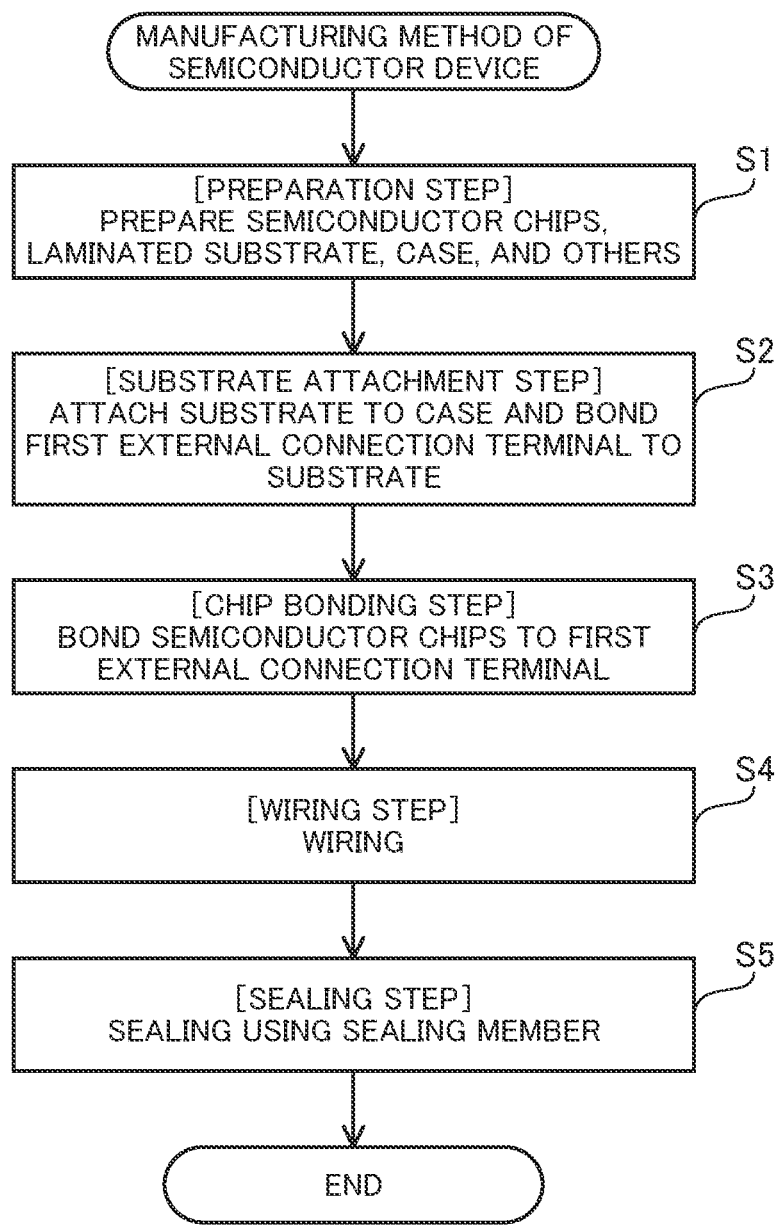
FIG. 3 is a flowchart of a semiconductor device manufacturing method according to the first embodiment.
Figure 4:
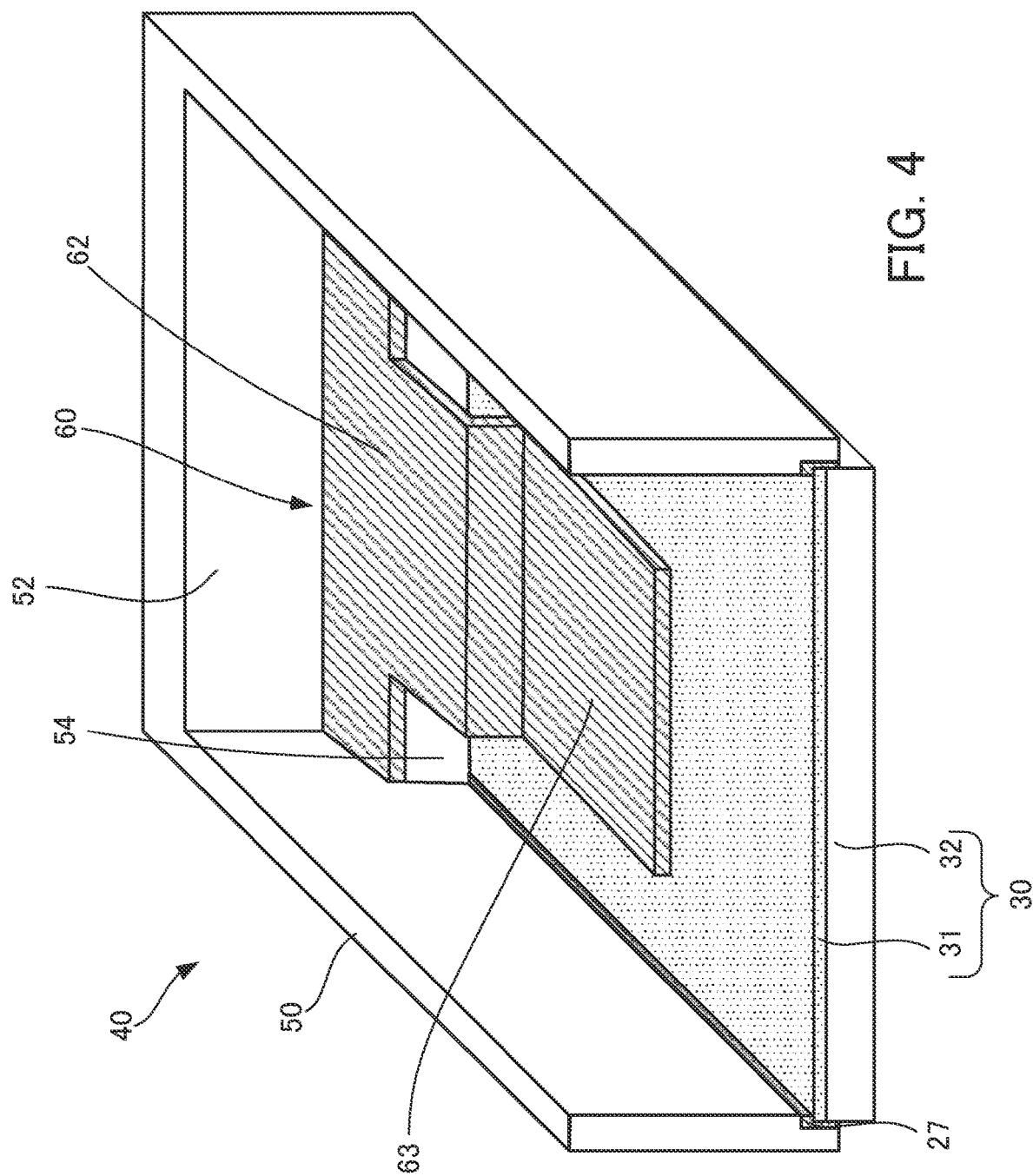
FIG. 4 is a view for explaining a substrate attachment step included in the semiconductor device manufacturing method according to the first embodiment.

The following describes how to manufacture the semiconductor device 10 with reference to FIGS. 3 and 4 in addition to FIGS. 1 and 2. FIG. 3 is a flowchart illustrating a semiconductor device manufacturing method according to the first embodiment. FIG. 4 is a view for explaining a substrate attachment step included in the semiconductor device manufacturing method according to the first embodiment. Note that FIG. 4 illustrates only the laminated substrate 30 and the case 40 attached to the laminated substrate 30 on the side where the first external connection terminal 60 exists.

First, a preparation step is executed to prepare the components of the semiconductor device 10 including the semiconductor chips 20, laminated substrate 30, case 40, and others (step S1). In this connection, in the case 40, the first and second external connection terminals 60 and 70 and control terminals 65 are insert-molded into the frame 50 in advance. Note that the insulating board 31 of the laminated substrate 30 at this stage is in a semi-cured state.

Then, a substrate attachment step is executed to apply the adhesive member 27 to the rear surface of the frame 50 of the case 40 and the periphery of the laminated substrate 30 and attach the periphery of the laminated substrate 30 to the rear surface of the frame 50 (step S2). After attaching the laminated substrate 30 to the case 40 in this way, the rear surface of the first wiring part 63 of the first external connection terminal 60 is in contact with the front surface of the insulating board 31 in the semi-cured state of the laminated substrate 30, as illustrated in FIG. 4.

Then, a chip bonding step is executed to mechanically and electrically bond the semiconductor chips 20 to the front surface of the first wiring part 63 of the first external connection terminal 60 with the bonding member 28 (step S3). By heating the bonding member 28 in this step, the insulating board 31 in the semi-cured state and the adhesive member 27 are cured. By doing so, the laminated substrate 30 is bonded to the rear surface of the frame 50 of the case 40, and the rear surface of the first wiring part 63 of the first external connection terminal 60 is fixed to the front surface of the insulating board 31.

Then, a wiring step is executed to wire the output electrodes and control electrodes on the front surfaces of the semiconductor chips 20 with the main wires 25a and control wires 25b by ultrasonic bonding (step S4). A bonding device is used to connect the control wiring parts 67 of the control terminals 65 and the control electrodes of the semiconductor chips 20 with the control wires 25b by ultrasonic bonding. In addition, the second wiring part 73 of the second external connection terminal 70 and the output electrode of each semiconductor chip 20 are connected to each other with the main wires 25a. In this connection, either the main wires 25a or control wires 25b may be used for the connections first.

At this time, the input electrodes on the rear surfaces of the semiconductor chips 20 are disposed directly on the first external connection terminal 60 (first wiring part 63). Therefore, a step of connecting the input electrodes of the semiconductor chips 20 and the first external connection terminal 60 with wires is eliminated. That is, the number of steps in the manufacturing is reduced.

Then, a sealing step is executed to seal the opening 51 of the case 40 with the sealing member (step S5). The opening 51 of the case 40 is filled with the sealing member 26 in a liquid state. By doing so, the semiconductor chip 20, first and second wiring parts 63 and 73, and others in the opening 51 are sealed by the sealing member 26. After that, the sealing member 26 sealing the opening 51 in this way is cured. With the above steps, the semiconductor device 10 illustrated in FIGS. 1 and 2 is obtained.

The above-described semiconductor device includes the semiconductor chips 20 each having a main electrode (first main electrode) on their rear surface, the laminated substrate 30 including the insulating board 31 and the heat dissipation board 32 laminated on the rear surface of the insulating board 31, and the case 40. The case 40 includes the frame 50 that surrounds the opening 51 penetrating from the front surface to the rear surface of the case 40 and contacts with the periphery of the laminated substrate covering the opening 51 from the rear surface of the case, and the first external connection terminal penetrating the frame 50. The first external connection terminal 60 includes the first connection part 61 provided outside the frame 50 and the first wiring part 63 which is provided in the opening 51, whose rear surface (wiring rear surface) is disposed on the front surface of the insulating board 31, and whose front surface (wiring front surface) is mechanically and electrically connected to the main electrodes on the rear surfaces of the semiconductor chips 20. Since the semiconductor chips 20 are disposed on the first wiring part 63 of the first external connection terminal 60, a step of connecting the main electrodes on the rear surfaces of the semiconductor chips 20 and the first external connection terminal 60 is eliminated, which reduces the manufacturing cost.

Second Embodiment

Figure 5:
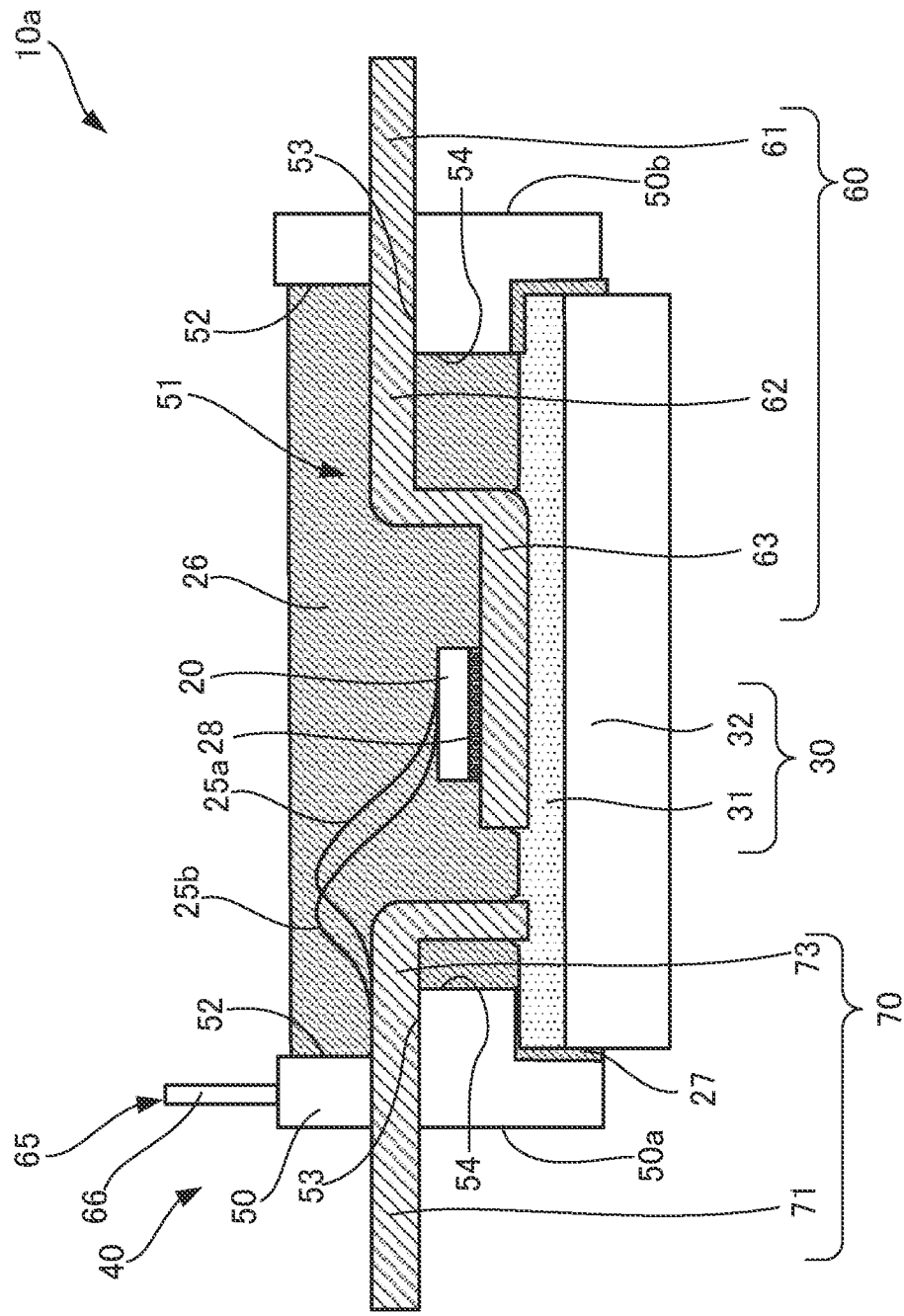
FIG. 5 is a sectional view of a semiconductor device according to a second embodiment.

In a second embodiment, the semiconductor device 10 of the first embodiment is modified so that the first wiring part 63 of the first external connection terminal 60 is embedded in the insulating board 31 of the laminated substrate 30. This case will be described with reference to FIG. 5 (together with FIG. 3). FIG. 5 is a sectional view of a semiconductor device according to the second embodiment. In the semiconductor device 10a of FIG. 5, the rear surface of a first wiring part 63 of a first external connection terminal 60 is positioned vertically lower than the front surface of an insulating board 31 of a laminated substrate 30. In addition, the tip end face of a second wiring part 73 of a second external connection terminal 70 is positioned vertically lower than the front surface of the insulating board 31 as well.

When attaching the laminated substrate 30 to a case 40 at the substrate attachment step S2 of FIG. 3 in manufacturing this semiconductor device 10a, the rear surface of the first wiring part 63 of the first external connection terminal 60 is pressed against the front surface of the insulating board 31 in a semi-cured state. At this time, the tip end face of the second wiring part 73 of the second external connection terminal 70 is pressed as well. By curing the insulating board 31 in the pressed state, the lower part of the first wiring part 63 of the first external connection terminal 60 and the tip end face of the second wiring part 73 of the second external connection terminal 70 are embedded in the insulating board 31 (see FIG. 5). Thus formed insulating board 31 has a recessed arrangement area that corresponds to the rear surface of the first wiring part 63. The rear surface of the first wiring part 63 fits the recessed arrangement area of the insulating board 31.

At the wiring step S4 of FIG. 3, main wires 25a and control wires 25b are wire-bonded to semiconductor chips 20 by ultrasonic bonding. As described earlier, the first and second external connection terminals 60 and 70 and others individually made using a metal as a principal component are insert-molded into a frame 50 made of a resin in the case 40. Since the metal and resin do not stick together, a gap may occur between the frame 50 and the first and second external connection terminals 60 and 70. However, even when the ultrasonic vibration is transmitted to the semiconductor chips 20, the first wiring part 63 of the first external connection terminal 60 is not misaligned because the first wiring part 63 fits the recessed arrangement area of the insulating board 31. Therefore, the distribution of the ultrasonic vibration is suppressed, so that the ultrasonic vibration is certainly transmitted to the semiconductor chips 20, and thus the main wires 25a and control wires 25b are bonded to the semiconductor chips 20 without fail.

In view of the above, with respect to the semiconductor device 10a of the second embodiment, a step of connecting the input electrodes on the rear surfaces of the semiconductor chips 20 and the first external connection terminal 60 with wires is eliminated, thereby reducing the manufacturing cost. In addition, in the semiconductor device 10a, the main wires 25a and control wires 25b are bonded to the semiconductor chips 20 without fail, which reduces the occurrence of electrical defects. As a result, a decrease in the reliability of the semiconductor device 10a is prevented.

Third Embodiment

Figure 6:
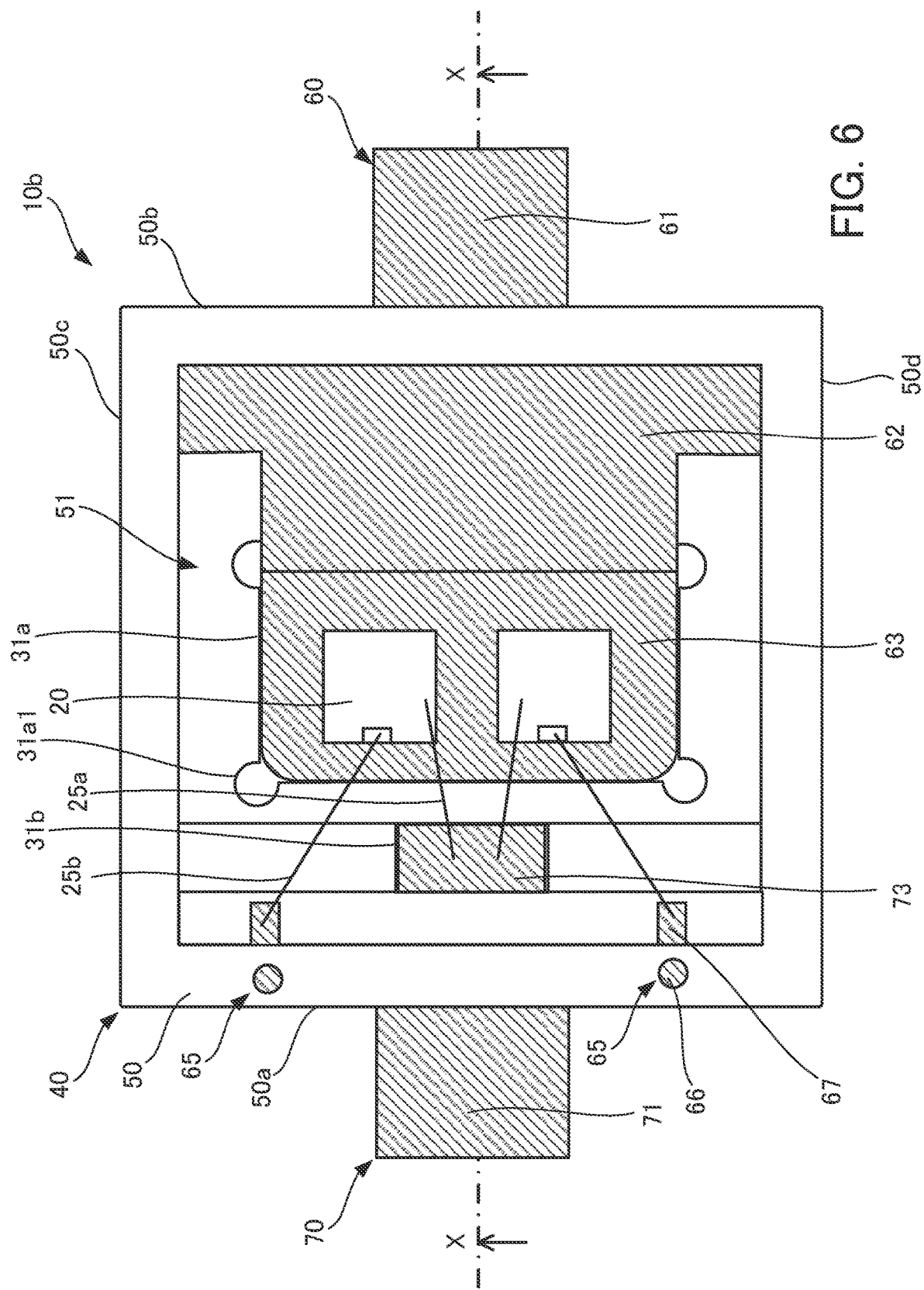
FIG. 6 is a plan view of a semiconductor device according to a third embodiment.
Figure 7:
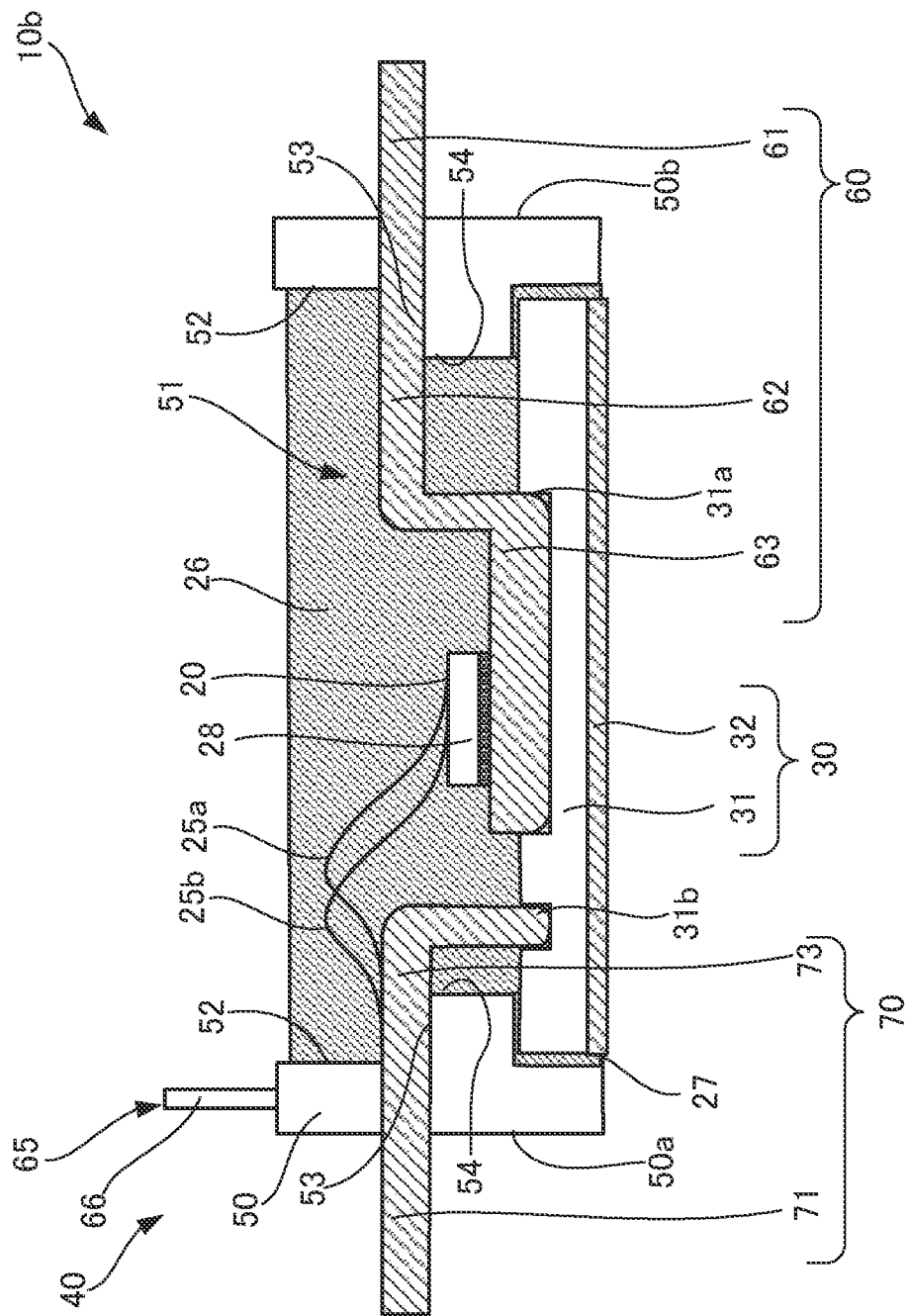
FIG. 7 is a sectional view of the semiconductor device according to the third embodiment.

In a third embodiment, the semiconductor device 10 of the first embodiment is modified so that the first wiring part 63 of the first external connection terminal 60 is embedded in the insulating board 31 of the laminated substrate 30. This case will be described with reference to FIGS. 6 and 7 (together with FIG. 3). Note that an insulating board of the third embodiment is a ceramics substrate. FIG. 6 is a plan view of a semiconductor device according to the third embodiment. FIG. 7 is a sectional view of the semiconductor device according to the third embodiment. Note that FIG. 7 is a sectional view taken along the dot-dashed line of FIG. 6. In the semiconductor device 10b illustrated in FIGS. 6 and 7, the rear surface of a first wiring part of a first external connection terminal 60 is positioned vertically lower than the front surface of the insulating board 31 of a laminated substrate 30. In addition, the tip end face of a second wiring part of a second external connection terminal 70 is positioned vertically lower than the front surface of the insulating board 31 as well. In this connection, in the semiconductor device 10b of the third embodiment, the insulating board 31 is a ceramics substrate. In addition, in the front surface of the insulating board 31, recessed terminal arrangement areas 31a and 31b are formed, whose planar shapes correspond to the rear surface of the first wiring part 63 and the tip end face of the second wiring part 73, respectively.

To manufacture this semiconductor device 10b, at the preparation step S1 of FIG. 3, the recessed terminal arrangement areas 31a and 31b are formed in advance in the insulating board 31 of the laminated substrate 30. In this connection, the recessed terminal arrangement areas 31a and 31b may be rectangular in a plan view. In addition, a circular release part 31a1 may be provided at each corner of the rectangle. Then, when attaching the laminated substrate 30 to the case 40 at the substrate attachment step S2 of FIG. 3, the first wiring part 63 of the first external connection terminal 60 is fit to the terminal arrangement area 31a in the front surface of the insulating board 31. At this time, the tip end face of the second wiring part 73 of the second external connection terminal 70 is fit to the terminal arrangement area 31b as well. By doing so, the first wiring part 63 of the first external connection terminal 60 and the second wiring part 73 of the second external connection terminal 70 are fixed to the terminal arrangement areas 31a and 31b of the insulating board 31, respectively (see FIGS. 6 and 7).

At the wiring step S4 of FIG. 3, main wires 25a and control wires 25b are wire-bonded to the semiconductor chips 20 by ultrasonic bonding. As in the second embodiment, even when ultrasonic vibration is transmitted to the semiconductor chips 20, misalignment of the first wiring part 63 of the first external connection terminal 60 with respect to the insulating board 31 does not occur because the first wiring part 63 of the first external connection terminal 60 fits the terminal arrangement area 31a of the insulating board 31. Therefore, the distribution of the ultrasonic vibration is suppressed, so that the ultrasonic vibration is certainly transmitted to the semiconductor chips 20, and thus the main wires 25a and control wires 25b are bonded to the semiconductor chips 20 without fail. In addition, the circular release part 31a1 is formed at each corner of the recessed terminal arrangement areas 31a. This contributes to distributing stress caused by fitting the first wiring part 63 to the terminal arrangement area 31a and by the ultrasonic bonding of the semiconductor chips 20 onto the first wiring part 63 and thus to reducing a risk of damage to the insulating board 31. In this connection, a release part may be formed at each corner of the terminal arrangement area 31b.

In view of the above, with respect to the semiconductor device 10b of the third embodiment, a step of connecting the input electrodes on the rear surfaces of the semiconductor chips 20 and the first external connection terminal 60 with wires is eliminated, thereby reducing the manufacturing cost. In addition, in the semiconductor device 10b, the main wires 25a and control wires 25b are bonded to the semiconductor chips 20 without fail, which reduces the occurrence of electrical defects. As a result, a decrease in the reliability of the semiconductor device 10b is prevented.

Fourth Embodiment

Figure 8:
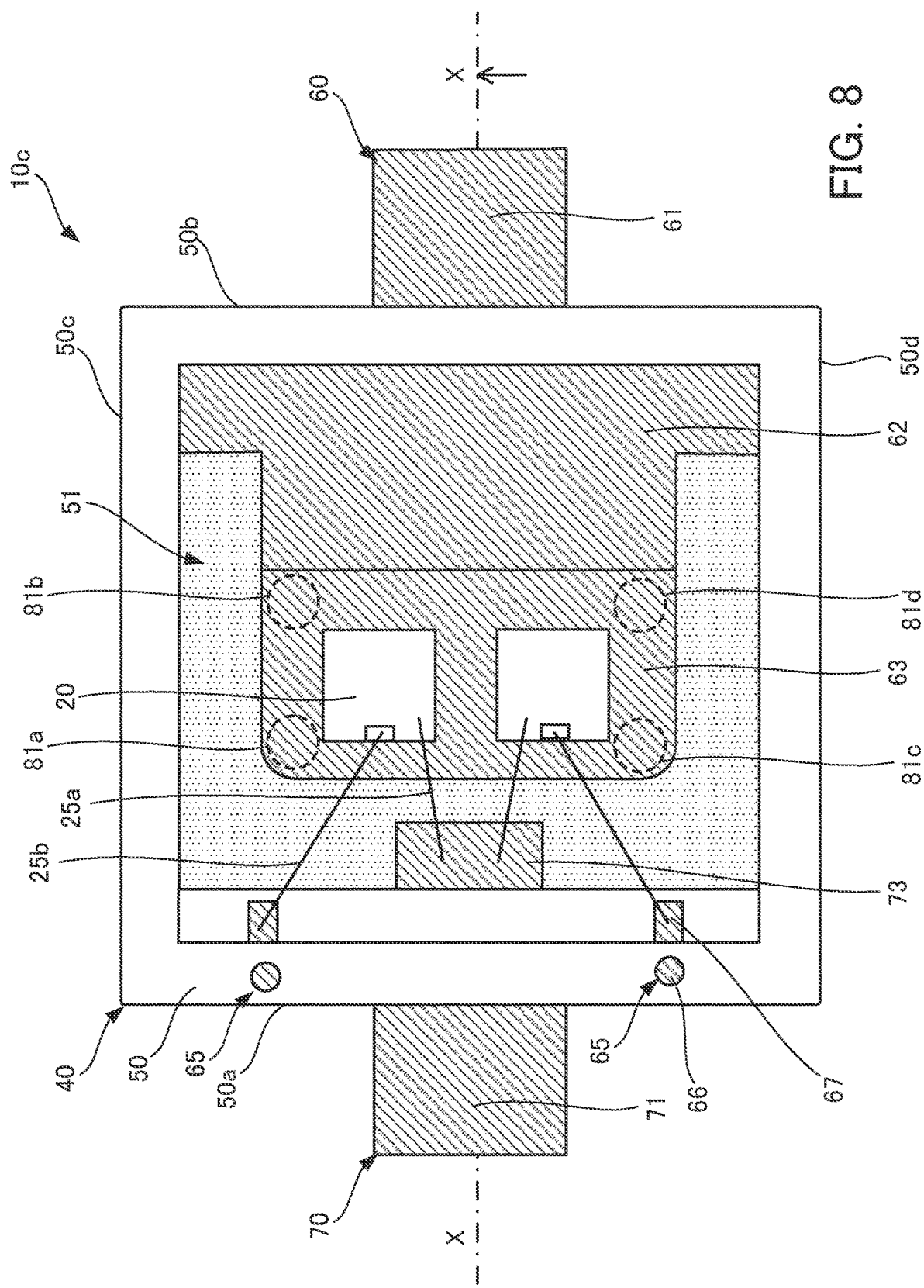
FIG. 8 is a plan view of a semiconductor device according to a fourth embodiment.
Figure 9:
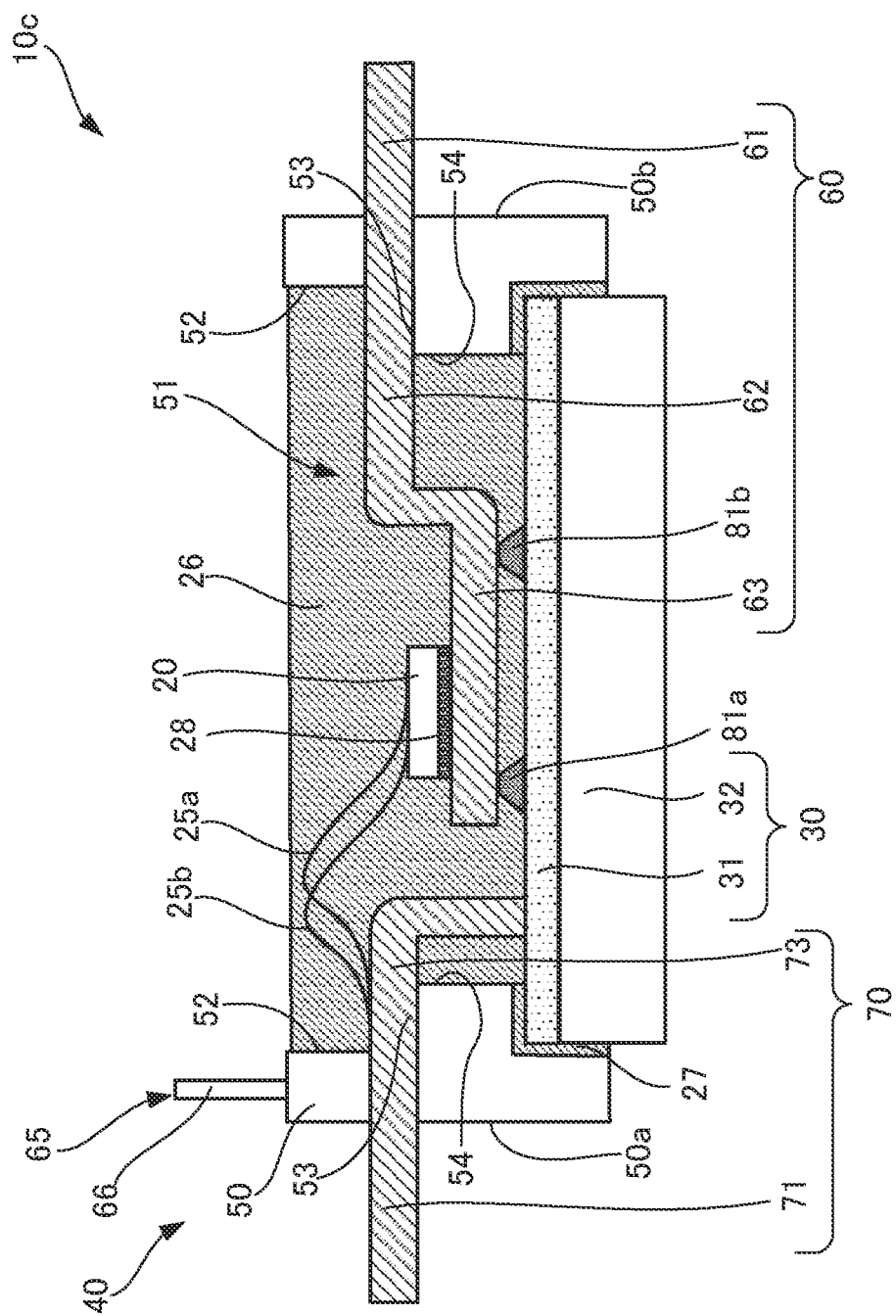
FIG. 9 is a sectional view of the semiconductor device according to the fourth embodiment.

In the fourth embodiment, the semiconductor device 10 of the first embodiment is modified so that spacers are disposed between the first wiring part 63 of the first external connection terminal 60 and the insulating board 31 of the laminated substrate 30. This case will be described with reference to FIGS. 8 and 9 (together with FIG. 3). FIG. 8 is a plan view of a semiconductor device according to the fourth embodiment, and FIG. 9 is a sectional view of the semiconductor device according to the fourth embodiment. In this connection, FIG. 9 is a sectional view taken along the dot-dashed line X-X of FIG. 8.

In the semiconductor device 10c of the fourth embodiment, spacers 81a to 81d are disposed between the four corners of the rear surface of a first wiring part 63 of a first external connection terminal 60 and the front surface of an insulating board 31 of a laminated substrate 30. The spacers 81a to 81d are made of a metal or a resin. In addition, the spacers 81a to 81d are equal in height. For example, the spacers 81a to 81d are frusto-conical. The spacers 81a to 81d are not limited to the frusto-conical shape but may be cubic or cylindrical as long as the spacers 81*a* to 81*d* are equal in height. The number and arrangement positions of the spacers 81*a* to 81*d* are not limited to the case where the four spacers 81*a* to 81*d* are disposed at four corners of the first wiring part 63, as long as the first wiring part 63 is disposed stably. For example, a spacer may be disposed at the center of the first wiring part 63 or spacers may be disposed at positions corresponding to the spacers 81*a* and 81*c* and the position corresponding to the middle between the spacers 81*b* and 81*d*. In addition, a sealing member 26 is provided in the gap between the rear surface of the first wiring part 63 and the front surface of the insulating board 31.

To manufacture this semiconductor device 10*c*, the spacers 81*a* to 81*d* are additionally prepared at the preparation step S1 of FIG. 3. Then, when attaching the laminated substrate 30 to a case 40 at the substrate attachment step S2 of FIG. 3, the first wiring part 63 of the first external connection terminal 60 is made to contact with the front surface of the insulating board 31 via the spacers 81*a* to 81*d*. Thereby, the first wiring part 63 of the first external connection terminal 60 is disposed over the insulating board 31 stably (see FIGS. 8 and 9). At this time of the contact, the spacers 81*a* to 81*d* may be embedded in the insulating board 31, as in the second embodiment. This reduces the risk of misalignment of the spacers 81*a* to 81*d* and thus further reduces the risk of the misalignment of the first wiring part 63 of the first external connection terminal 60.

At the wiring step S4 of FIG. 3, main wires 25*a* and control wires 25*b* are wire-bonded to semiconductor chips 20 by ultrasonic bonding. At this time, the first wiring part 63 of the first external connection terminal 60 is disposed over the insulating board 31 stably, so that the misalignment is avoided. Therefore, the distribution of the ultrasonic vibration is suppressed, so that the ultrasonic vibration is certainly transmitted to the semiconductor chips 20 and thus the main wires 25*a* and control wires 25*b* are bonded to the semiconductor chips 20 without fail.

At the sealing step S5 of FIG. 3, an opening 51 of the case 40 is filled with the sealing member 26 in a liquid state. Thereby, the sealing member 26 fills the gap between the rear surface of the first wiring part 63 and the front surface of the insulating board 31 as well. Then, by curing the sealing member 26, the rear surface of the first wiring part 63 and the front surface of the insulating board 31 are bonded together.

In view of the above, with respect to the semiconductor device 10*c* of the fourth embodiment, a step of connecting the input electrodes on the rear surfaces of the semiconductor chips 20 and the first external connection terminal 60 with wires is eliminated, thereby reducing the manufacturing cost. In addition, in the semiconductor device 10*c*, the main wires 25*a* and control wires 25*b* are bonded to the semiconductor chips 20 without fail, which reduces the risk of electrical defects. As a result, a decrease in the reliability of the semiconductor device 10*c* is prevented.

In this connection, the insulating board 31 may be a ceramics substrate. In this case, it is preferable that recesses corresponding to the shapes of the spacers 81*a* to 81*d* are formed where the spacers 81*a* to 81*d* are disposed in the insulating board 31, in order to avoid the misalignment of the spacers 81*a* to 81*d*.

Fifth Embodiment

Figure 10:
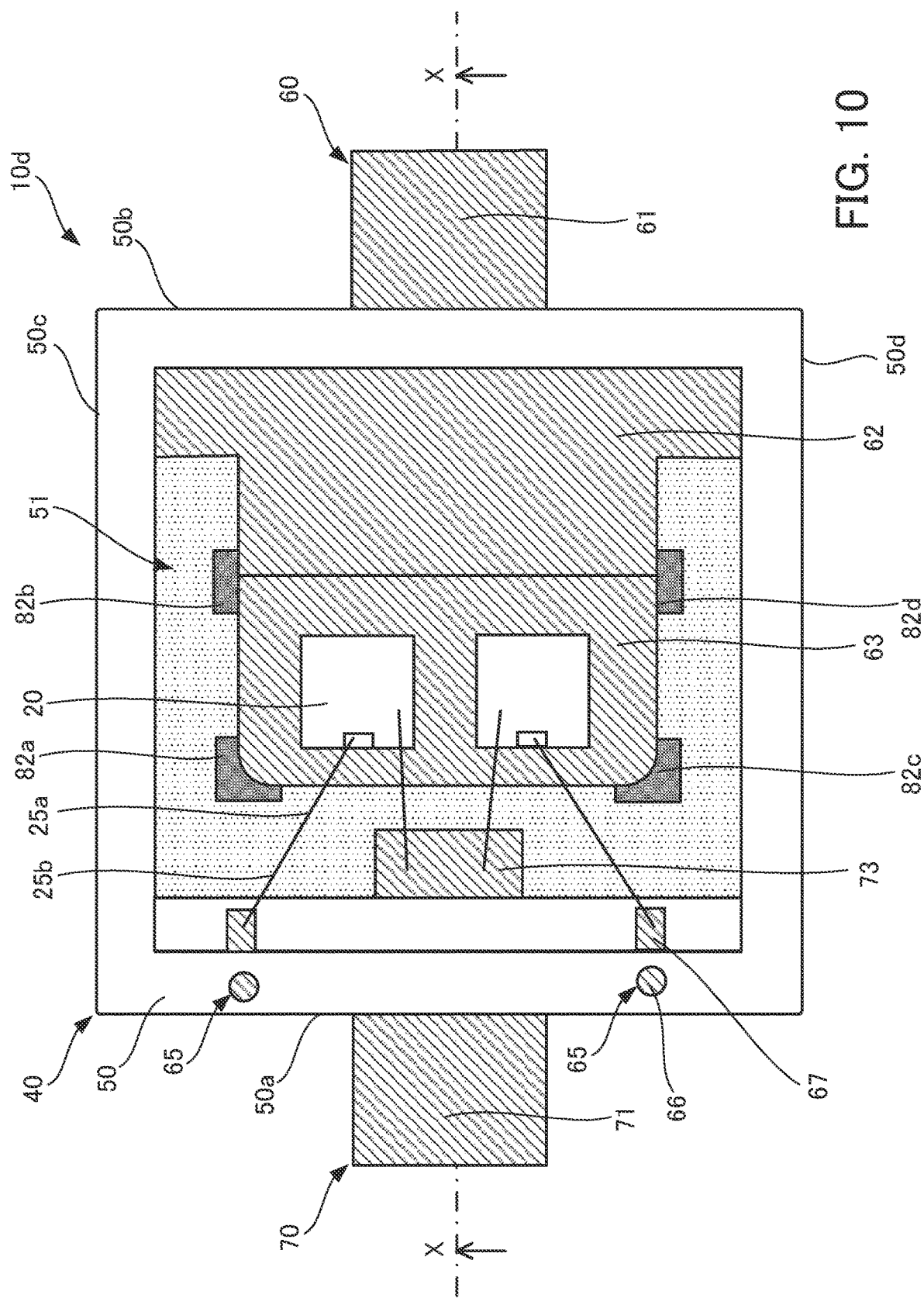
FIG. 10 is a plan view of a semiconductor device according to a fifth embodiment.
Figure 11:
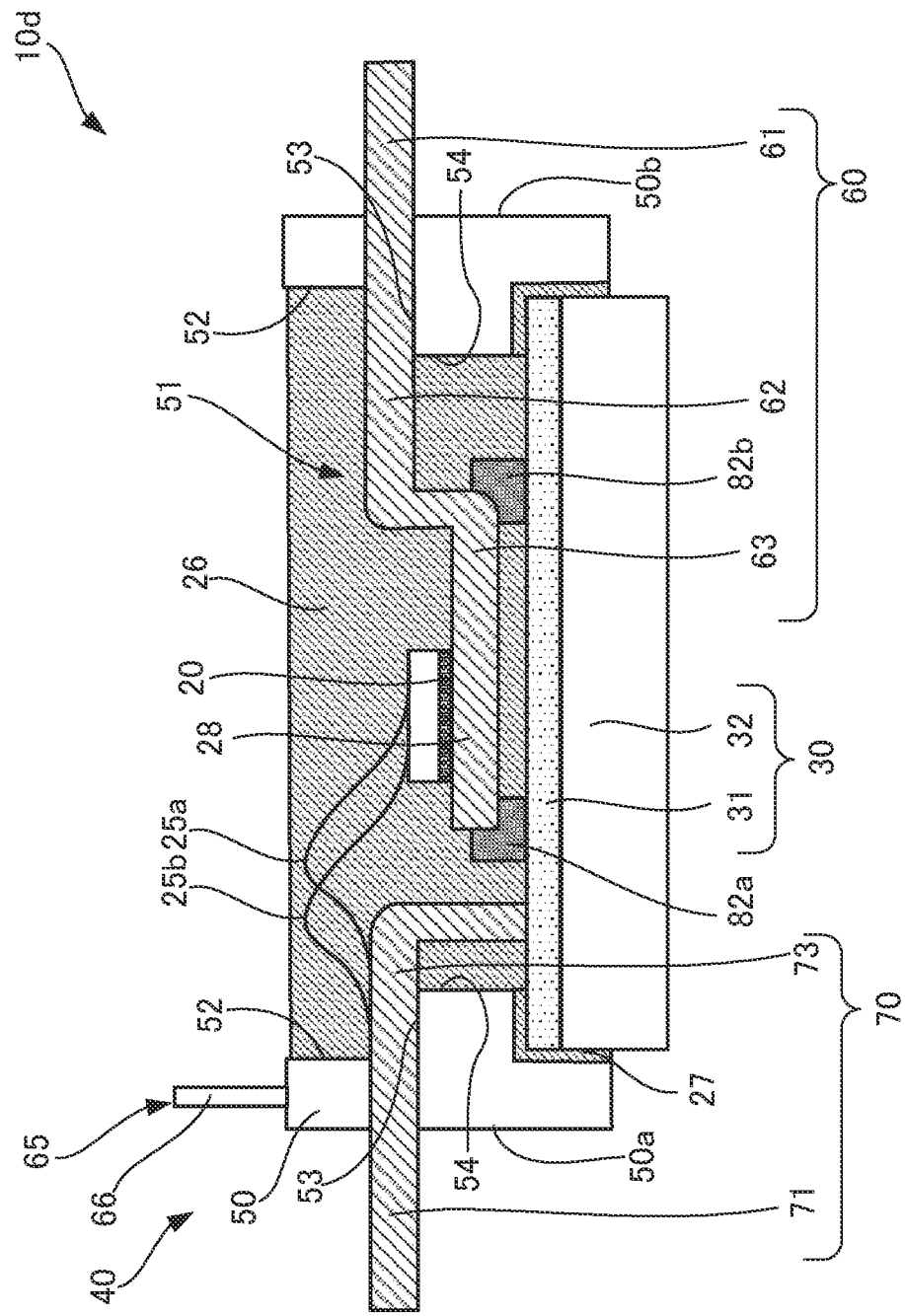
FIG. 11 is a sectional view of the semiconductor device according to the fifth embodiment.

The fifth embodiment uses different spacers from the fourth embodiment. This case will be described with reference to FIGS. 10 and 11 (together with FIG. 3). FIG. 10 is a plan view of a semiconductor device according to the fifth embodiment, and FIG. 11 is a sectional view of the semiconductor device according to the fifth embodiment. In this connection, FIG. 11 is a sectional view taken along the dot-dashed line X-X of FIG. 10.

In the semiconductor device 10*d* of the fifth embodiment, spacers 82*a* to 82*d* are disposed between the four corners of a first wiring part 63 of a first external connection terminal 60 and an insulating board 31 of a laminated substrate 30. The spacers 82*a* to 82*d* are made of a metal or a resin. In addition, the spacers 82*a* to 82*d* are equal in height. For example, the spacers 82*a* to 82*d* are rectangular in a plan view, and a recess (stepped portion) is formed at a corner of each spacer corresponding to one of the corners of the first wiring part 63 of the first external connection terminal 60. Therefore, the spacers 82*a* to 82*d* disposed between the four corners of the first wiring part 63 of the first external connection terminal 60 and the laminated substrate 30 fit the corners of the first wiring part 63 of the first external connection terminal 60 (see FIGS. 10 and 11). In addition, a sealing member 26 is provided in the gap between the rear surface of the first wiring part 63 and the front surface of the insulating board 31.

To manufacture this semiconductor device 10*d*, the spacers 82*a* to 82*d* are additionally prepared at the preparation step S1 of FIG. 3. Then, when attaching the laminated substrate 30 to a case 40 at the substrate attachment step S2 of FIG. 3, the first wiring part 63 of the first external connection terminal 60 are made to contact with the front surface of the insulating board 31 via the spacers 82*a* to 82*d*. At this time, the spacers 82*a* to 82*d* are placed at positions corresponding to the four corners of the first wiring part 63. Thereby, the first wiring part of the first external connection terminal 60 is disposed over the insulating board 31 with the four corners of the first wiring part 63 fitting the recesses of the spacers 82*a* to 82*d* (see FIGS. 10 and 11). At the time of this disposition, the spacers 82*a* to 82*d* may be embedded in the insulating board 31, as in the second embodiment. This reduces the risk of misalignment of the spacers 82*a* to 82*d* and thus further reduces the risk of the misalignment of the first wiring part 63 of the first external connection terminal 60.

At the wiring step S4 of FIG. 3, main wires 25*a* and control wires 25*b* are wire-bonded to semiconductor chips 20 by ultrasonic bonding. At this time, the first wiring part 63 of the first external connection terminal 60 is disposed over the insulating board 31 stably, so that the misalignment is avoided. Therefore, the distribution of the ultrasonic vibration is suppressed, so that the ultrasonic vibration is certainly transmitted to the semiconductor chips 20, and thus the main wires 25*a* and control wires 25*b* are bonded to the semiconductor chips 20 without fail.

At the sealing step S5 of FIG. 3, an opening 51 of the case 40 is filled with the sealing member 26 in a liquid state. Thereby, the sealing member 26 fills the gap between the rear surface of the first wiring part 63 and the front surface of the insulating board 31. Then, by curing the sealing member 26, the rear surface of the first wiring part and the front surface of the insulating board 31 are bonded together.

In view of the above, with respect to the semiconductor device 10*d* of the fifth embodiment, a step of connecting the input electrodes on the rear surfaces of the semiconductor chips 20 and the first external connection terminal 60 with wires is eliminated, thereby reducing the manufacturing cost. In addition, in the semiconductor device 10*d*, the main wires 25*a* and control wires 25*b* are bonded to the semiconductor chips 20 without fail, which reduces the occurrence of electrical defects. As a result, a decrease in the reliability of the semiconductor device 10d is prevented.

In this connection, the insulating board 31 may be a ceramics substrate. In this case, it is preferable that recesses corresponding to the shapes of the spacers 82a to 82d are formed where the spacers 82a to 82d are disposed in the insulating board 31, in order to avoid the misalignment of the spacers 82a to 82d.

Sixth Embodiment

Figure 12:
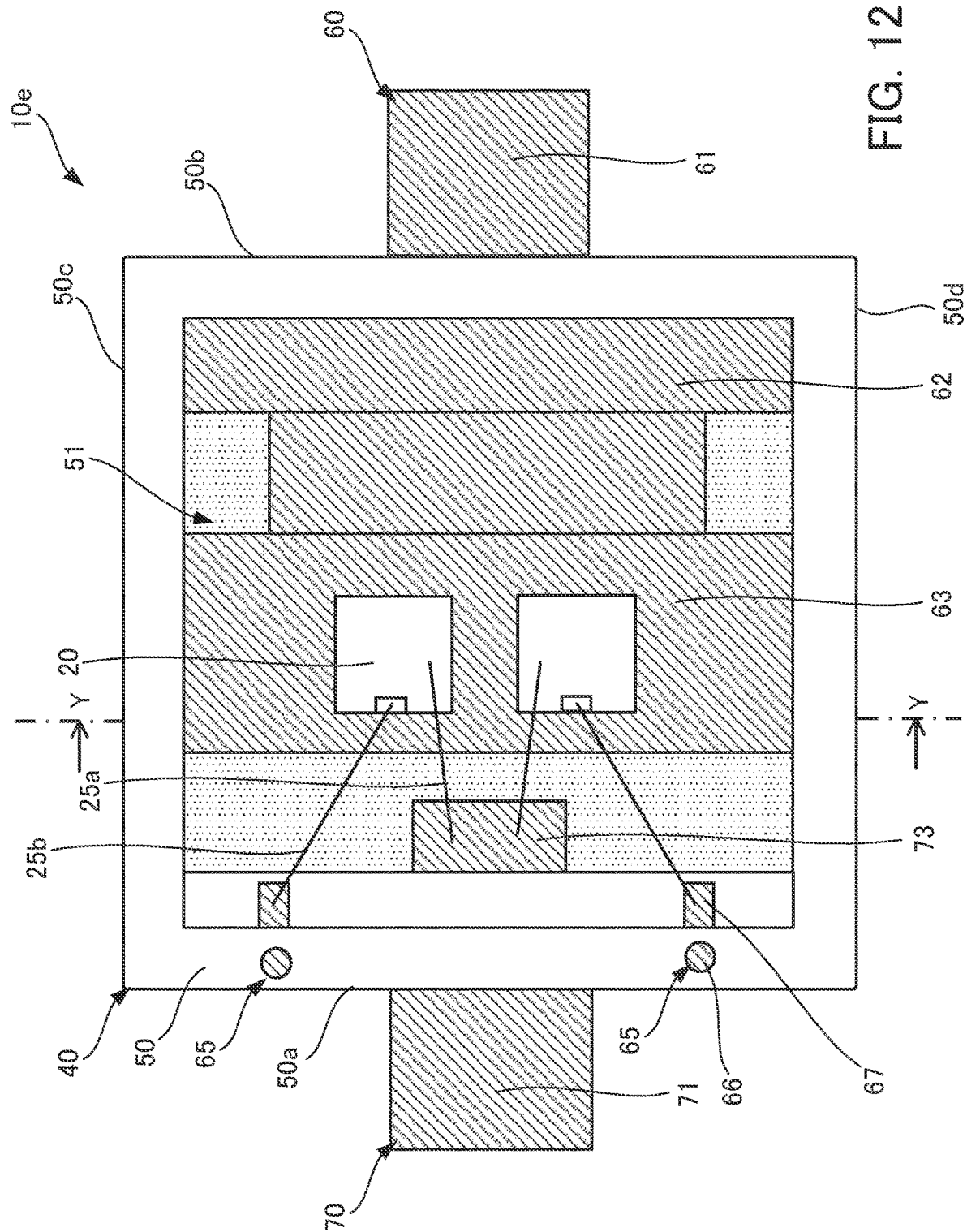
FIG. 12 is a plan view of a semiconductor device according to a sixth embodiment.
Figure 13:
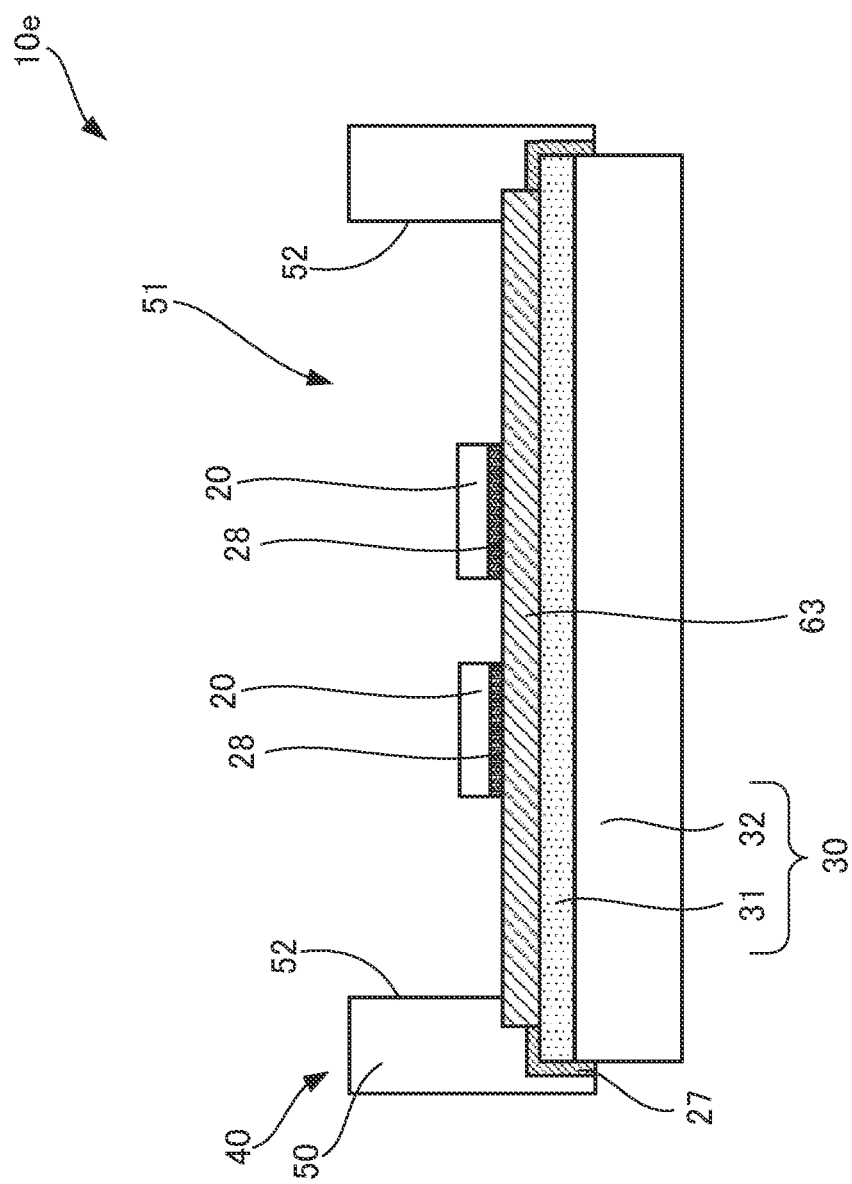
FIG. 13 is a sectional view of the semiconductor device according to the sixth embodiment.

In the sixth embodiment, a first wiring part 63 of a first external connection terminal 60 is made wide and is fixed by a case 40. This case will be described with reference to FIGS. 12 and 13 (together with FIG. 3). FIG. 12 is a plan view of a semiconductor device according to the sixth embodiment, and FIG. 13 is a sectional view of the semiconductor device according to the sixth embodiment. In this connection, FIG. 13 is a sectional view taken along the dot-dashed line Y-Y of FIG. 12.

In the semiconductor device 10e of the sixth embodiment, the width (the length between the upper inner walls 52 on the upper and bottom sides of FIG. 13) of the first wiring part 63 of the first external connection terminal 60 is larger than that of the first wiring part 63 of the first external connection terminal 60 of the semiconductor device 10 of the first embodiment. The width of the first wiring part 63 of the first external connection terminal 60 is slightly longer than that of an opening 51 of a frame 50 of the case 40. In this connection, the other configuration of the semiconductor device 10e of the sixth embodiment is the same as that of the semiconductor device 10 of the first embodiment. The both sides (in the width direction) of the first wiring part 63 of the first external connection terminal 60 are held by the periphery of a laminated substrate 30 and the rear surface of the frame 50 of the case 40 (see FIG. 13). In this connection, the both sides here refer to both sides in the width direction perpendicular to the penetrating direction (extension direction) of the first external connection terminal 60 penetrating a side portion 50b of the frame 50.

In manufacturing this semiconductor device 10e, in the first external connection terminal 60 that is insert-molded into the case 40 prepared at the preparation step S1 of FIG. 3, the width of the first wiring part 63 is set long so that the both sides of the first wiring part 63 reach the rear surface of the frame 50. At the substrate attachment step S2 of FIG. 3, the laminated substrate 30 is attached to the case in the same way as in the first embodiment. However, in this case, the both sides of the first wiring part 63 is sandwiched by the rear surface of the frame 50 and the periphery of the insulating board 31. Thereby, the first wiring part 63 of the first external connection terminal 60 is fixed by the case 40 and laminated substrate 30 (see FIGS. 12 and 13).

At the wiring step S4 of FIG. 3 after the chip bonding step S3 of FIG. 3, main wires 25a and control wires 25b are wire-bonded to semiconductor chips 20 by ultrasonic bonding. At this time, the first wiring part 63 of the first external connection terminal 60 is fixed by the case 40 and laminated substrate 30. Even by bonding the main wires 25a and control wires 25b to the semiconductor chips 20 by the ultrasonic bonding, the misalignment of the first wiring part 63 of the first external connection terminal 60 is avoided. Therefore, the distribution of the ultrasonic vibration is suppressed, so that the ultrasonic vibration is certainly transmitted to the semiconductor chips 20, and thus the main wires 25a and control wires 25b are bonded to the semiconductor chips 20 without fail. The insulating board 31 of the semiconductor device 10e is either an organic insulating layer or a ceramics substrate. In either case, the rear surface of the first wiring part 63 may be positioned vertically lower than the front surface of the insulating board 31, as in the second and third embodiments. This further avoids the misalignment of the first wiring part 63 of the first external connection terminal 60.

In view of the above, with respect to the semiconductor device 10e of the sixth embodiment, a step of connecting the input electrodes on the rear surfaces of the semiconductor chips 20 and the first external connection terminal 60 with wires is eliminated, thereby reducing the manufacturing cost. In addition, in the semiconductor device 10e, the main wires 25a and control wires 25b are bonded to the semiconductor chips 20 without fail, which reduces the occurrence of electrical defects. As a result, a decrease in the reliability of the semiconductor device 10d is prevented.

Seventh Embodiment

Figure 14:
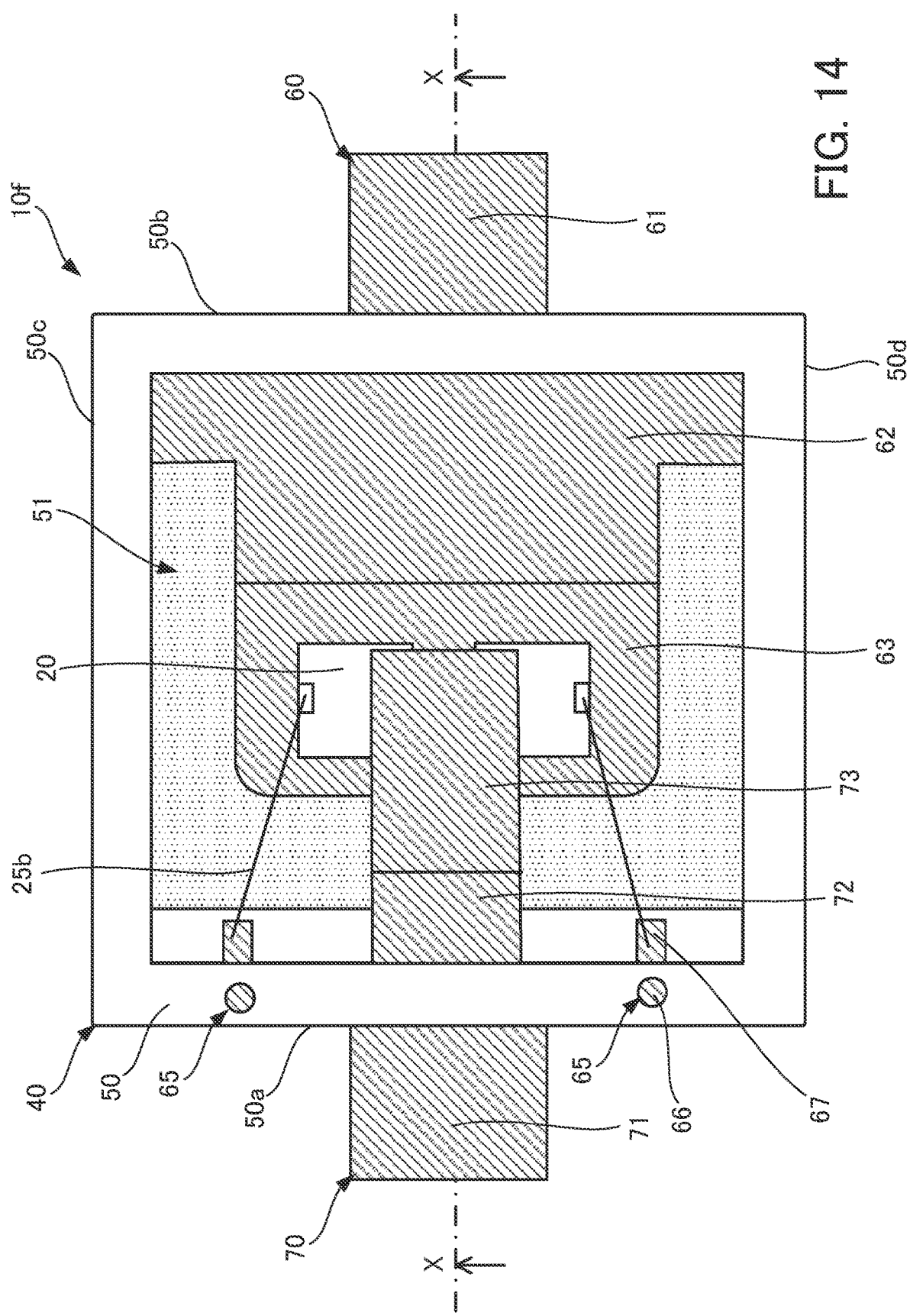
FIG. 14 is a plan view of a semiconductor device according to a seventh embodiment.
Figure 15:
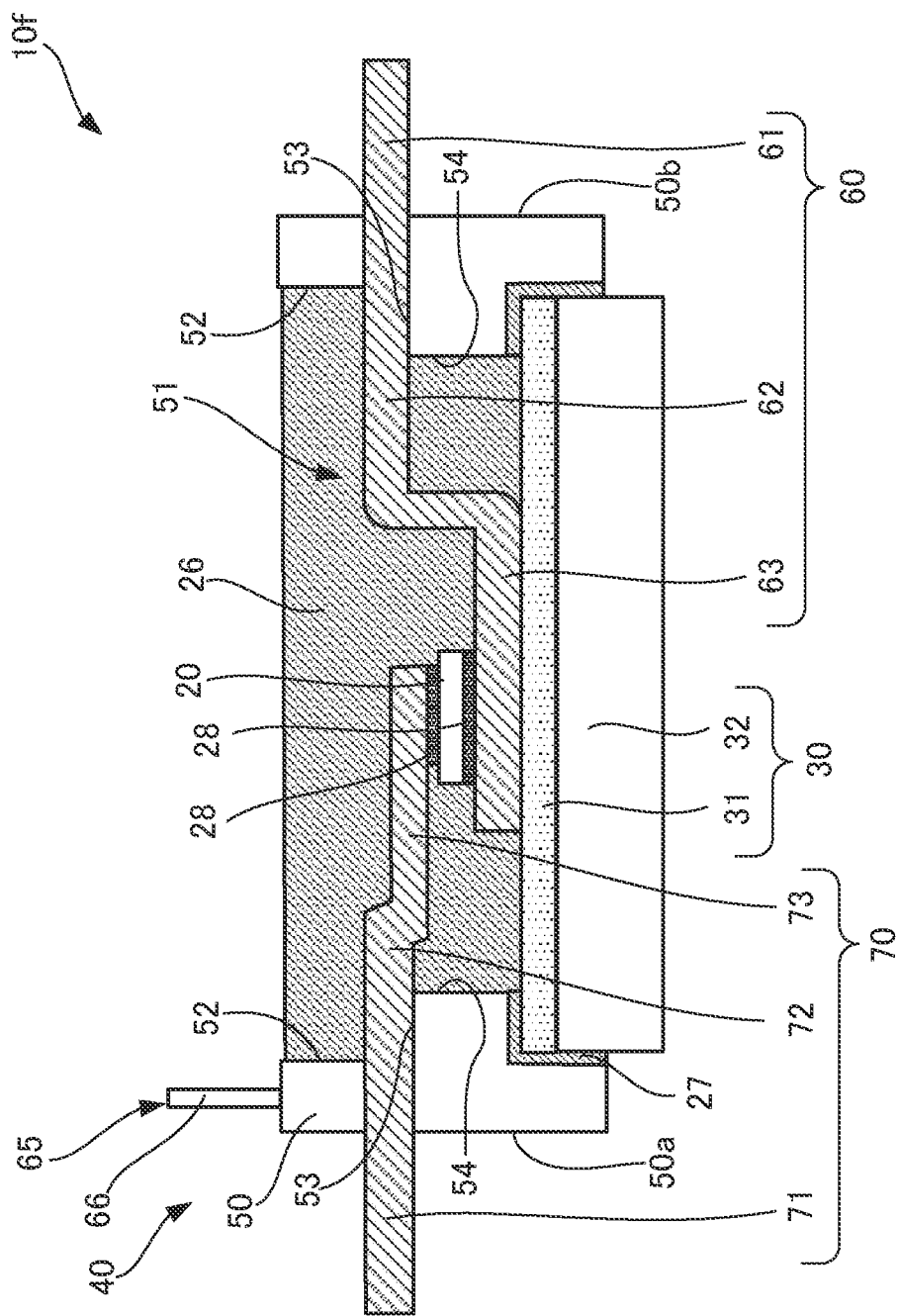
FIG. 15 is a sectional view of the semiconductor device according to the seventh embodiment.

In a seventh embodiment, the semiconductor device 10 of the first embodiment is modified so that the second external connection terminal 70 is bonded directly to the output electrodes of the semiconductor chips 20, instead of using the main wires 25a. This case will be described with reference to FIGS. 14 and (together with FIG. 3). FIG. 14 is a plan view of a semiconductor device according to the seventh embodiment, and FIG. 15 is a sectional view of the semiconductor device according to the seventh embodiment. In this connection, FIG. 15 is a sectional view taken along the dot-dashed line X-X of FIG. 14.

Different from the semiconductor device 10 of the first embodiment, the semiconductor device 10f of the seventh embodiment does not include the main wires 25a, and a second external connection terminal 70 that is bonded to semiconductor chips 20 is insert-molded into a frame 50 of a case 40.

The second external connection terminal 70 is insert-molded into a side portion 50a of the frame 50. The second external connection terminal 70 integrally includes a second connection part 71, a second linking part 72, and a second wiring part 73. The rear surface (wiring rear surface) of the second wiring part 73 is bonded to the output electrodes on the front surfaces of two semiconductor chips 20 via a bonding member 28 (see FIGS. 14 and 15). The second linking part 72 integrally links the second connection part 71 and the second wiring part 73. The second linking part 72 communicates with the second connection part 71, penetrates the side portion 50a of the frame 50, extends into the opening 51, and is placed on a terminal pedestal 53. The width of the second linking part 72 becomes narrower from where the second linking part 72 is placed on the terminal pedestal 53. The second linking part 72 extends into the opening 51, has approximately the same width as the second wiring part 73, and integrally communicates with the second wiring part 73. In addition, the control electrodes of the semiconductor chips 20 face toward the side portions 50c and 50d of the frame 50, respectively, and are electrically connected to control wiring parts 67 with control wires 25b.

To manufacture this semiconductor device 10f, in the second external connection terminal 70 that is insert-molded into the case 40 prepared at the preparation step S1 of FIG. 3, the second wiring part 73 is made to extend into the opening 51. At the substrate attachment step S2 of FIG. 3, a laminated substrate 30 is attached to the case 40 in the same manner as in the first embodiment. At this time, there is a gap between the front surface of the first wiring part 63 of the first external connection terminal 60 and the rear surface of the second wiring part 73 of the second external connection terminal 70.

Then, at the chip bonding step S3 of FIG. 3, the semiconductor chips 20 are disposed in the gap between the front surface of the first wiring part 63 and the rear surface of the second wiring part 73 with the bonding member 28 therebetween. Then, the bonding member 28 is heated to melt to bond the second wiring part 73 and the output electrodes (front surface) of the semiconductor chips 20 and also the input electrodes (rear surface) of the semiconductor chips 20 and the first wiring part 63. Then, at the wiring step S4 of FIG. 3, only the control wires 25b are wire-bonded to the semiconductor chips 20 by ultrasonic bonding.

At this time, the output electrodes on the front surfaces of the semiconductor chips 20 are bonded directly to the second external connection terminal 70 (second wiring part 73). Therefore, a step of connecting the output electrodes of the semiconductor chips 20 and the second external connection terminal 70 with wires is eliminated, which further reduces the number of steps in the manufacturing as compared with the first embodiment.

In view of the above, with respect to the semiconductor device 10f of the seventh embodiment, a step of connecting the second external connection terminal 70 and the output electrodes on the front surfaces of the semiconductor chips 20 with wires is eliminated, which further reduces the manufacturing cost as compared with the first embodiment. In this connection, in the semiconductor device 10f of the seventh embodiment, the lower part of the first wiring part 63 of the first external connection terminal 60 may be embedded in an insulating board 31 of the laminated substrate 30, as in the second and third embodiments. In addition, the semiconductor device 10f of the seventh embodiment may be modified so that spacers are disposed between the insulating board 31 of the laminated substrate 30 and the first wiring part 63 of the first external connection terminal 60, as in the fourth and fifth embodiments. In addition, the semiconductor device 10f of the seventh embodiment may be modified so that the first wiring part 63 of the first external connection terminal 60 is sandwiched by the case 40 and the laminated substrate 30, as in the sixth embodiment.

Eighth Embodiment

Figure 16:
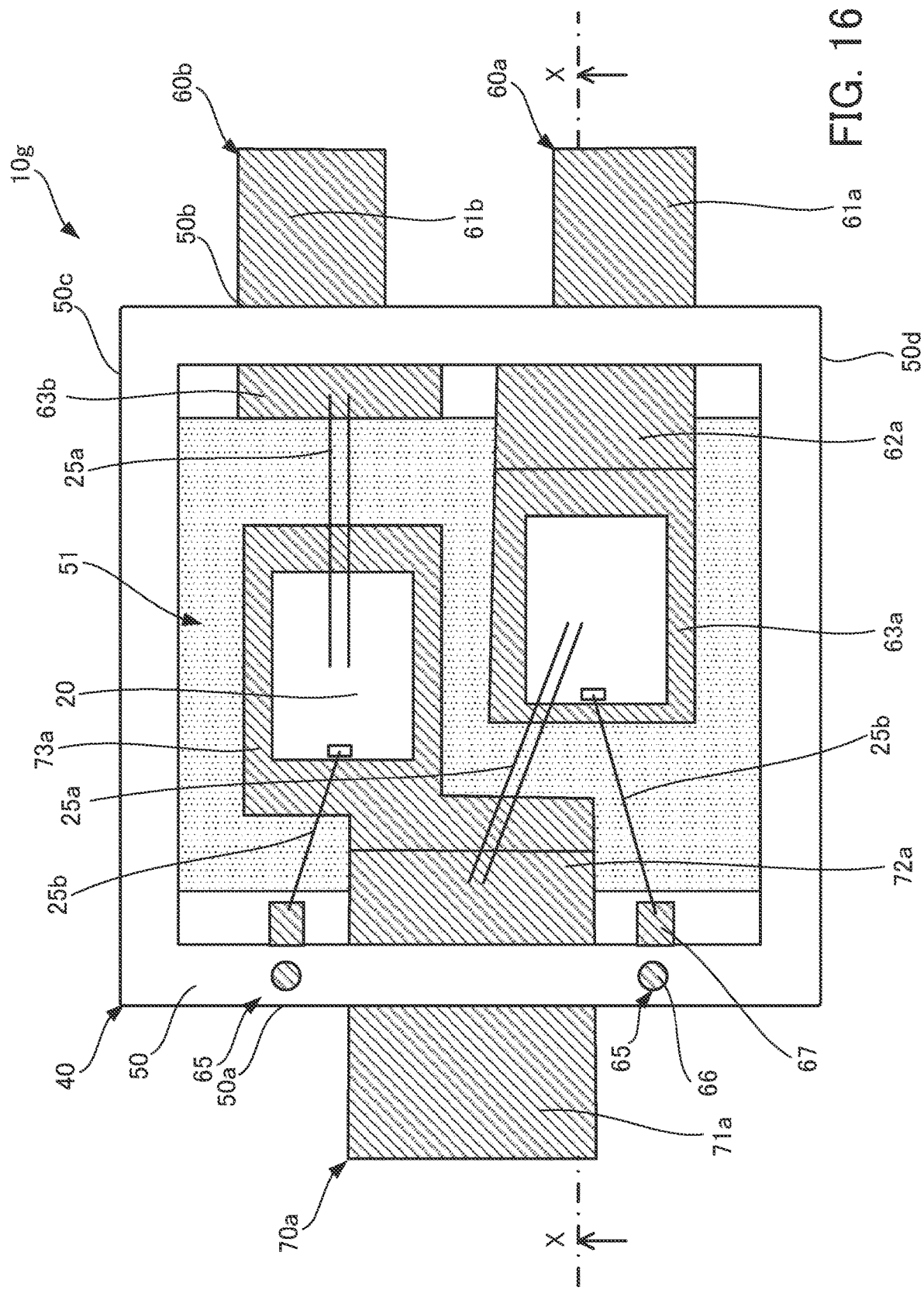
FIG. 16 is a plan view of a semiconductor device according to an eighth embodiment.
Figure 17:
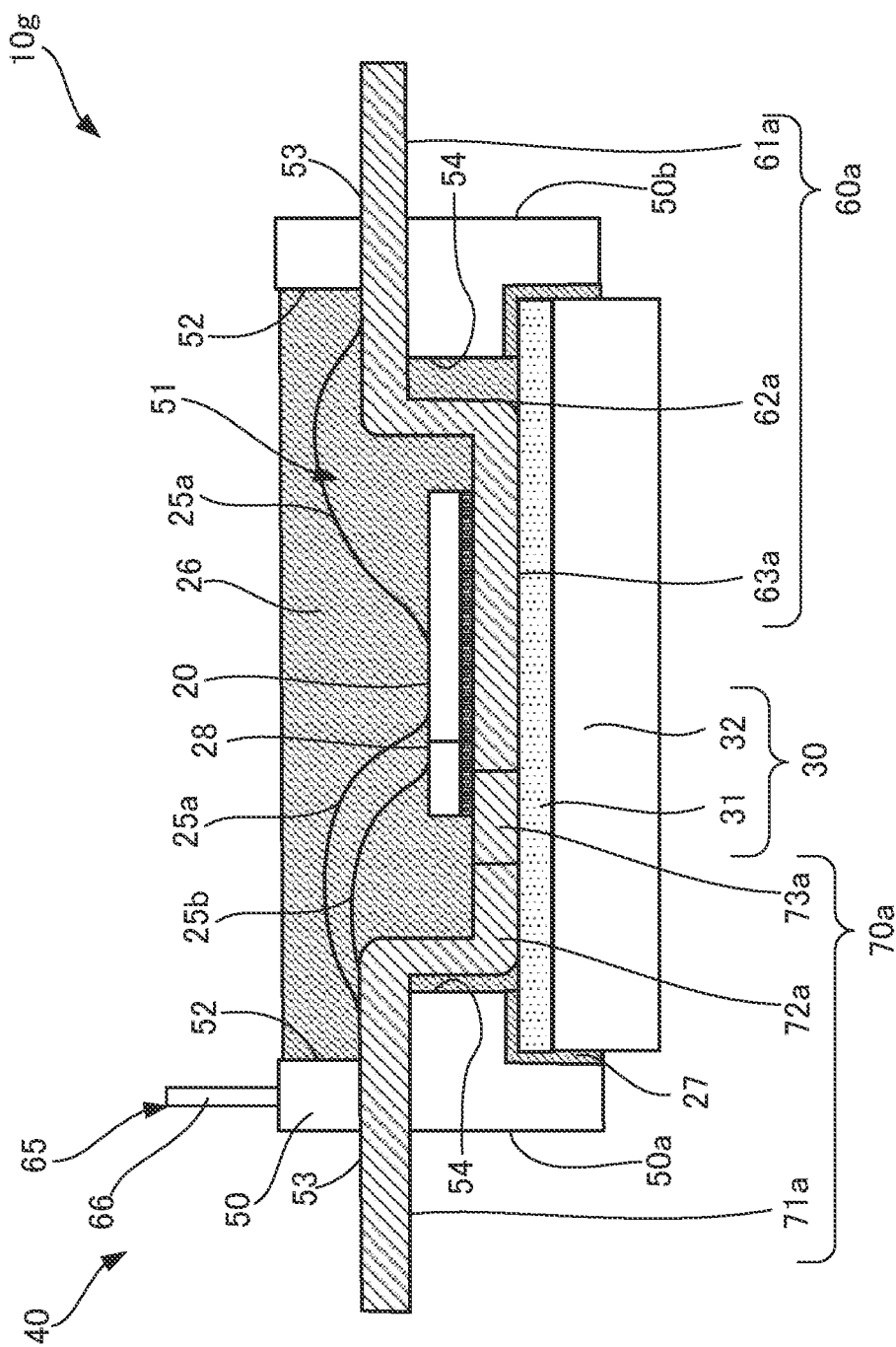
FIG. 17 is a sectional view of the semiconductor device according to the eighth embodiment.

A semiconductor device 10g of an eighth embodiment includes a different circuit configuration from the first embodiment. This case will be described with reference to FIGS. 16 and 17. FIG. 16 is a plan view of the semiconductor device according to the eighth embodiment, and FIG. 17 is a sectional view of the semiconductor device according to the eighth embodiment. In this connection, FIG. 17 is a sectional view taken along the dot-dashed line X-X of FIG. 16.

In a case 40 of the semiconductor device 10g of the eighth embodiment, a first external connection terminal 60a and a third external connection terminal 60b are insert-molded into a side portion 50b of a frame 50. In addition, a second external connection terminal 70a is insert-molded into a side portion 50a of the frame 50. Semiconductor chips 20 are bonded to the first external connection terminal 60a and second external connection terminal 70a. In addition, the second external connection terminal 70a and one semiconductor chip 20 are connected with main wires 25a. The third external connection terminal 60b and the other semiconductor chip 20 are connected with main wires 25a. The other configuration of the semiconductor device 10g is the same as that of the semiconductor device 10 of the first embodiment.

The first external connection terminal 60a integrally includes a first connection part 61a, a first linking part 62a, and a first wiring part 63a. The first connection part 61a extends from the side portion 50b of the frame 50 to the outside (to the right side in FIG. 16). The rear surface (wiring rear surface) of the first wiring part 63a is placed at approximately the center on the front surface of a laminated substrate 30. To the front surface (wiring front surface) of the first wiring part 63a, one semiconductor chip 20 (rear surface thereof) is mechanically and electrically bonded with a bonding member 28. The rear surface (wiring rear surface) of the first wiring part 63a is in contact with an insulating board 31 of the laminated substrate 30. The first linking part 62a integrally links the first connection part 61a and the first wiring part 63a. The first linking part 62a communicates with the first connection part 61a, penetrates the side portion 50b of the frame 50, extends into an opening 51, and is placed on the entire surface of a terminal pedestal 53.

The third external connection terminal 60b integrally includes a third connection part 61b and a third wiring part 63b. The third connection part 61b is adjacent to the first connection part 61a with a space therebetween and extends from the side portion 50b of the frame 50 to the outside (to the right side in FIG. 16). The third wiring part 63b communicates with the third connection part 61b, penetrates the side portion 50b of the frame 50, extends into the opening 51, and is placed on the terminal pedestal 53.

The second external connection terminal 70a integrally includes a second connection part 71a, a second linking part 72a, and a second wiring part 73a. The second connection part 71a extends from the side portion 50a of the frame 50 to the outside (to the left side in FIG. 16). The rear surface (wiring rear surface) of the second wiring part 73a is placed at approximately the center on the front surface of the laminated substrate 30 in anti-parallel to the first wiring part 63a of the first external connection terminal 60a with a space therebetween. To the front surface (wiring front surface) of the second wiring part 73a, the semiconductor chip 20 (rear surface thereof) is mechanically and electrically bonded with the bonding member 28. The rear surface (wiring rear surface) of the second wiring part 73a is in contact with the insulating board 31 of the laminated substrate 30. The second linking part 72a integrally links the second connection part 71a and the second wiring part 73a. The second linking part 72a communicates with the second connection part 71a, penetrates the side portion 50a of the frame 50, extends into the opening 51, and is placed on the entire surface of the terminal pedestal 53.

Inside the case 40, the main wires 25a connect the output electrode of the semiconductor chip 20 on the second wiring part 73a and the third wiring part 63b of the third external connection terminal 60b. The main wires 25a connect the output electrode of the semiconductor chip 20 on the first wiring part 63a and the second linking part 72a of the second external connection terminal 70a. In this connection, control wiring parts 67 of two control terminals 65 and the control electrodes of the two semiconductor chips 20 are electrically connected with control wires 25b, as in the first embodiment.

Then, a method of manufacturing the above-described semiconductor device 10g will be described with reference to FIGS. 16 and 17 together with FIG. 3. First, at the preparation step S1 of FIG. 3, the case in which the first, second, and third external connection terminals 60a, 70a, and 60b are insert-molded into the frame 50 as described earlier is prepared. At the substrate attachment step S2 of FIG. 3, an adhesive member 27 is applied to the rear surface of the frame 50 of the case 40 or the periphery of the laminated substrate 30, and the periphery of the laminated substrate 30 is bonded to the rear surface of the frame 50. At this time, the rear surface of the first wiring part 63a and the rear surface of the second wiring part 73a are in contact with the front surface of the insulating board 31.

Then, at the chip bonding step S3 of FIG. 3, one semiconductor chip 20 is mechanically and electrically bonded to the front surface of the first wiring part 63a of the first external connection terminal 60a with a bonding member 28. In addition, the other semiconductor chip 20 is mechanically and electrically bonded to the front surface of the second wiring part 73a of the second external connection terminal 70a with the bonding member 28. By heating the bonding member 28 at this step, the insulating board 31 in a semi-cured state and adhesive member 27 are cured. Thereby, the rear surface of the first wiring part 63a of the first external connection terminal 60a is fixed to the front surface of the insulating board 31 of the laminated substrate 30. The rear surface of the second wiring part 73a of the external connection terminal 70a is fixed to the front surface of the insulating board 31 of the laminated substrate 30.

Then, at the wiring step S4 of FIG. 3, a bonding device is used to connect the control wiring parts 67 of the control terminals 65 and the control electrodes of the semiconductor chips 20 with the control wires 25b. In addition, the second linking part 72a of the second external connection terminal 70a and the output electrode of the semiconductor chip on the first wiring part 63a are electrically connected with the main wires 25a. Still further, the third wiring part 63b of the third external connection terminal 60b and the output electrode of the semiconductor chip 20 on the second wiring part 73a are electrically connected with the main wires 25a. In this connection, the main wires 25a and control wires 25b may be used for the connections in any order.

At this time, the input electrodes on the rear surfaces of the semiconductor chips 20 are disposed directly on the first external connection terminal 60a (first wiring part 63a) and the second external connection terminal 70a (second wiring part 73a). Therefore, a step of connecting the input electrodes of the semiconductor chips 20 and the first and second external connection terminals 60a and 70a with wires is eliminated, thereby reducing the number of steps in the manufacturing. Then, at step S5 of FIG. 3, an opening 51 of the case 40 is sealed with a sealing member 26. In the manner described above, the semiconductor device 10g illustrated in FIGS. 16 and 17 is obtained.

In view of the above, with respect to the semiconductor device 10g of the eighth embodiment, a step of connecting the first and second external connection terminals 60a and 70a and the input electrodes on the rear surfaces of the semiconductor chips 20 is eliminated, thereby reducing the manufacturing cost. In this connection, in the eighth embodiment, the insulating board 31 is an organic insulating layer, but may be a ceramics substrate. In addition, the semiconductor device 10g of the eighth embodiment may be modified so that spacers are disposed between the insulating board 31 of the laminated substrate 30 and the first wiring part 63a of the first external connection terminal 60a, as in the fourth and fifth embodiments. In addition, the semiconductor device 10g of the eighth embodiment may be modified so that the first wiring part 63a of the first external connection terminal 60a is sandwiched by the case 40 and the laminated substrate 30, as in the sixth embodiment.

The disclosed technique reduces the manufacturing cost, reduces the occurrence of electrical defects, and prevents a decrease in the reliability of a semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
    a semiconductor chip including a first electrode on a rear surface thereof;
    a laminated substrate including an insulating board and a heat dissipation board laminated on a rear surface of the insulating board; and
    a case, including
        a frame surrounding an opening penetrating the case from a front surface of the case to a rear surface of the case, the frame being in contact with a periphery of the laminated substrate, the laminated substrate covering the opening from the rear surface of the case, and
        a first terminal penetrating the frame, the first terminal including
            a first connection part penetrating the frame and extending out of the frame,
            a first wiring part provided in the opening, the first wiring part having
                a wiring rear surface disposed on a front surface of the insulating board, and
                a wiring front surface mechanically and electrically connected to the first electrode of the semiconductor chip, and
            a first linking part integrally linking the first connection part and the first wiring part.

2. The semiconductor device according to claim 1, wherein the wiring rear surface of the first wiring part is flush with the front surface of the insulating board.

3. The semiconductor device according to claim 1, wherein:
    a recess corresponding to the wiring rear surface of the first wiring part is formed in the front surface of the insulating board;
    the first wiring part is disposed in the recess; and
    the wiring rear surface of the first wiring part is positioned closer to the heat dissipation board than to the front surface of the insulating board.

4. The semiconductor device according to claim 3, wherein the wiring rear surface of the first wiring part of the first terminal is fitted into the recess of the insulating board.

5. The semiconductor device according to claim 1, wherein the first wiring part of the first terminal is disposed over the front surface of the insulating board via a spacer.

6. The semiconductor device according to claim 5, wherein
    the first wiring part has four corners, and
    the spacer is disposed at each of the four corners on the wiring rear surface of the first wiring part.

7. The semiconductor device according to claim 5, wherein
the first wiring part has four corners, and
the spacer is fitted to each of the four corners, so as to support the first wiring part from the wiring rear surface.

8. The semiconductor device according to claim 5, wherein the spacer is made of a resin or a metal.

9. The semiconductor device according to claim 1, wherein
the first wiring part extends in a direction perpendicular to a penetrating direction of the first terminal penetrating the frame, such that two ends thereof both reach the frame, and
each of the two ends of the first wiring part is sandwiched between the laminated substrate and the frame.

10. The semiconductor device according to claim 1, wherein the insulating board is a resin sheet.

11. The semiconductor device according to claim 1, wherein the insulating board is made of ceramics.

12. The semiconductor device according to claim 1, further comprising:
a second terminal that includes
a second connection part penetrating the frame and extending out of the frame, and
a second wiring part extending from an inner wall of the frame into the opening.

13. The semiconductor device according to claim 12, wherein:
the semiconductor chip includes a second electrode on a front surface thereof;
the second wiring part extends to the second electrode of the semiconductor chip, and has a wiring rear surface that is mechanically and electrically connected to the second electrode of the semiconductor chip.

14. The semiconductor device according to claim 12, further comprising:
a wiring member that electrically connects the semiconductor chip and the second wiring part.

15. The semiconductor device according to claim 1, wherein the semiconductor chip is a first semiconductor chip, and the semiconductor device further includes a second semiconductor chip;
wherein the case further includes
a second terminal including a second connection part and a second wiring part, the second connection part penetrating a side portion of the frame opposite to the first terminal and extending out of the frame, the second wiring part being provided in the opening and having
a wiring rear surface thereof disposed on the front surface of the insulating board, and
a wiring front surface mechanically and electrically connected to the second semiconductor chip, and
a third terminal including a third connection part and a third wiring part, the third connection part penetrating the frame and extending out of the frame, the third wiring part extending from an inner wall of the frame into the opening; and
wherein the semiconductor device further includes a wiring member that electrically connects an electrode of the second semiconductor chip and the third wiring part.

16. A method of manufacturing a semiconductor device, comprising:
preparing a semiconductor chip including
a first electrode on a rear surface thereof,
a laminated substrate including an insulating board and a heat dissipation board laminated on a rear surface of the insulating board, and
a case, including
a frame surrounding an opening penetrating the case from a front surface of the case to a rear surface of the case, and
a first terminal including a first connection part, a first linking part, and a first wiring part, the first connection part penetrating the frame and extending out of the frame, the first wiring part extending into the opening and having a wiring rear surface and a wiring front surface, the first linking part integrally linking the first connection part and the first wiring part;
attaching the laminated substrate from the rear surface of the case to cover the opening, and disposing the first wiring part onto the insulating board of the laminated substrate with the wiring rear surface of the first wiring part facing a front surface of the insulating board; and
bonding the first electrode of the semiconductor chip to the wiring front surface of the first wiring part.

17. The method according to claim 16, wherein the attaching includes disposing the first wiring part so that the wiring rear surface of the first wiring part is positioned closer to the heat dissipation board than to the front surface of the insulating board.

18. The method according to claim 17, wherein
the insulating board has a recess formed on the front surface thereof, and
the wiring rear surface of the first wiring part of the first terminal is fitted into the recess.

* * * * *